United States Patent
Arelakis et al.

(10) Patent No.: US 12,124,420 B2
(45) Date of Patent: Oct. 22, 2024

(54) SYSTEMS, METHODS AND DEVICES FOR ELIMINATING DUPLICATES AND VALUE REDUNDANCY IN COMPUTER MEMORIES

(71) Applicant: ZEROPOINT TECHNOLOGIES AB, Gothenburg (SE)

(72) Inventors: Angelos Arelakis, Gothenburg (SE); Per Stenström, Torslanda (SE)

(73) Assignee: ZEROPOINT TECHNOLOGIES AB, Gothenburg (SE)

( * ) Notice: Subject to any disclaimer, the term of this patent is extended or adjusted under 35 U.S.C. 154(b) by 173 days.

(21) Appl. No.: 17/421,800

(22) PCT Filed: Jan. 9, 2020

(86) PCT No.: PCT/SE2020/050013
§ 371 (c)(1),
(2) Date: Jul. 9, 2021

(87) PCT Pub. No.: WO2020/145874
PCT Pub. Date: Jul. 16, 2020

(65) Prior Publication Data
US 2022/0100718 A1   Mar. 31, 2022
US 2023/0076729 A2   Mar. 9, 2023

(30) Foreign Application Priority Data

Jan. 11, 2019  (SE) .................... 1950027-1

(51) Int. Cl.
*G06F 16/215*  (2019.01)
*G06F 12/0804*  (2016.01)
*G06F 16/22*  (2019.01)

(52) U.S. Cl.
CPC ........ *G06F 16/215* (2019.01); *G06F 12/0804* (2013.01); *G06F 16/2246* (2019.01); *G06F 2212/1044* (2013.01)

(58) Field of Classification Search
CPC ............... G06F 16/215; G06F 12/0804; G06F 16/2246; G06F 2212/1044; G06F 12/0292;
(Continued)

(56) References Cited

U.S. PATENT DOCUMENTS 6,671,454 B1 * 12/2003 Kaneko ............... H04N 5/9205
                                                386/E5.013
9,843,702 B1 * 12/2017 Wallace ............... H03M 7/3091
(Continued)

FOREIGN PATENT DOCUMENTS

CN    108427539 A    8/2018
EP    2 905 709      8/2015
(Continued)

OTHER PUBLICATIONS

International Search Report and Written Opinion mailed on Apr. 28, 2020 by the International Searching Authority for International Application No. PCT/SE2020/050013, filed on Jan. 9, 2019 and published as WO 2020/145874 on Jul. 16, 2020 (Applicant—Zeropoint Technologies AB) (10 pages).
(Continued)

*Primary Examiner* — Maher N Algibhah
(74) *Attorney, Agent, or Firm* — Ballard Spahr LLP

(57) ABSTRACT

A computer memory compression method involves analyzing computer memory content with respect to occurrence of duplicate memory objects as well as value redundancy of data values in unique memory objects. The computer memory content is encoded by eliminating the duplicate memory objects and compressing each remaining unique memory object by exploiting data value locality of the data values thereof. Metadata is provided to represent the memory objects of the encoded computer memory content. The metadata reflects eliminated duplicate memory objects,
(Continued)

remaining unique memory objects as well as a type of compression used for compressing each remaining unique memory object. A memory object in the encoded computer memory content is located using the metadata.

33 Claims, 12 Drawing Sheets

(58) Field of Classification Search
CPC .......... G06F 12/023; G06F 12/04; G06F 2212/1024; G06F 12/08; G06F 3/0608; G06F 3/064; G06F 12/0882; G06F 12/1009; G06F 16/1748; G06F 16/17; G06F 16/174; H03M 7/6029; H03M 7/3088; H03M 7/3091; H03M 7/405
See application file for complete search history.

(56) References Cited

U.S. PATENT DOCUMENTS

| | | | |
|---|---|---|---|
| 2005/0071579 A1* | 3/2005 | Luick | G06F 12/0802 |
| | | | 711/170 |
| 2012/0323860 A1* | 12/2012 | Yasa | G06F 16/1748 |
| | | | 707/E17.005 |
| 2013/0318051 A1 | 11/2013 | Kumar | |
| 2014/0310476 A1 | 10/2014 | Kruus et al. | |
| 2017/0235640 A1 | 8/2017 | Lee et al. | |
| 2018/0121516 A1 | 5/2018 | Ohtsuji | |
| 2018/0196817 A1 | 7/2018 | Maybee et al. | |
| 2020/0105021 A1* | 4/2020 | Sohre | G06T 1/60 |

FOREIGN PATENT DOCUMENTS

| | | |
|---|---|---|
| WO | 2010097960 A1 | 9/2010 |
| WO | 2016186563 A1 | 11/2016 |
| WO | WO 2017/188985 | 11/2017 |

OTHER PUBLICATIONS

C. Liu, et al. "ADMAD: Application Driven Metadata Aware De-duplication Archival Storage System", 2008 Fifth IEEE International Workshop on Storage Network Architecture and Parallel I/Os, Baltimore, MD (2008) pp. 29-35.

Zhou B, et al. "Metadata feedback and Utilization for Data Deduplication Across WAN" Journal of Computer Science and Technology, 31(3): 604-623: May 2016.

Japanese Notice of Reasons for Refusal issued in related application No. JP2021-538111 mailed Jan. 12, 2024.

* cited by examiner

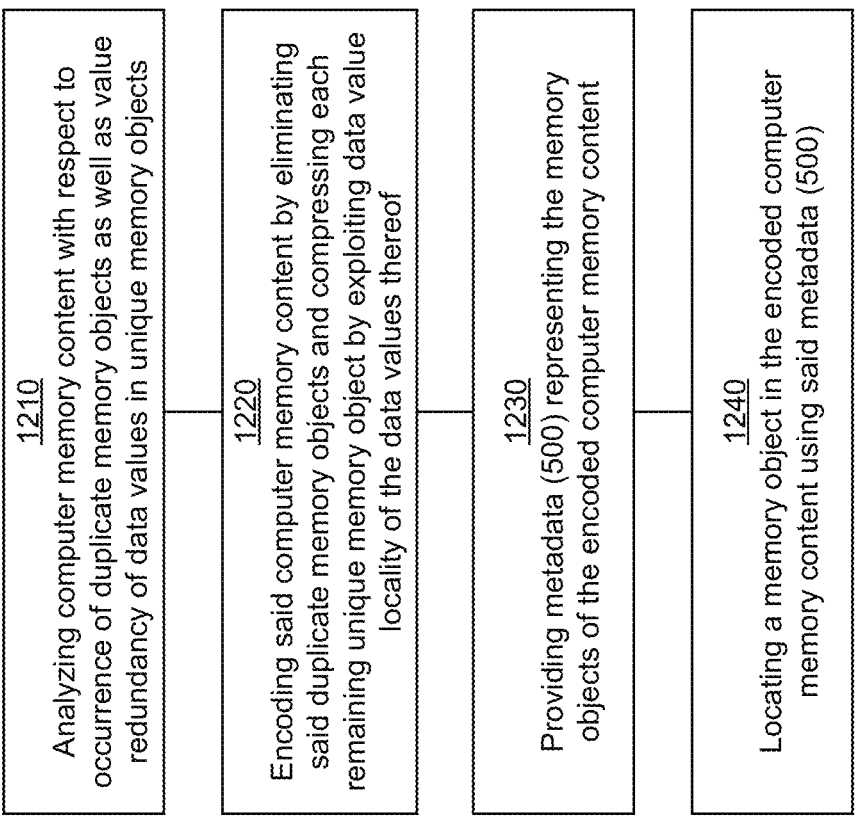

SYSTEMS, METHODS AND DEVICES FOR ELIMINATING DUPLICATES AND VALUE REDUNDANCY IN COMPUTER MEMORIES

CROSS-REFERENCE TO RELATED APPLICATIONS

This application is a U.S. National Phase Application of International Application No. PCT/SE2020/050013, filed Jan. 9, 2020, which claims priority to Swedish Application No. 1950027-1, filed Jan. 11, 2019, each of which are hereby incorporated by reference in their entirety.

TECHNICAL FIELD

This subject matter generally relates to the field of data compression in memories in electronic computers.

BACKGROUND

Data compression is a general technique to store and transfer data more efficiently by coding frequent collections of data more efficiently than less frequent collections of data. It is of interest to generally store and transfer data more efficiently for a number of reasons. In computer memories, for example memories that keep data and computer instructions that processing devices operate on, for example in main or cache memories, it is of interest to store said data more efficiently, say K times, as it then can reduce the size of said memories potentially by K times, using potentially K times less communication capacity to transfer data between one memory to another memory and with potentially K times less energy expenditure to store and transfer said data inside or between computer systems and/or between memories. Alternatively, one can potentially store K times more data in available computer memory than without data compression. This can be of interest to achieve potentially K times higher performance of a computer without having to add more memory, which can be costly or can simply be less desirable due to resource constraints. As another example, the size and weight of a smartphone, a tablet, a lap/desktop or a set-top box can be limited as a larger or heavier smartphone, a tablet, a lap/desktop or a set-top box could be of less value for an end user; hence potentially lowering the market value of such products. Yet, more memory capacity or higher memory communication bandwidth can potentially increase the market value of the product as more memory capacity or memory communication bandwidth can result in higher performance and hence better utility of the product.

To summarize, in the general landscape of computerized products, including isolated devices or interconnected ones, data compression can potentially increase the performance, lower the energy expenditure, increase the memory communication bandwidth or lower the cost and area consumed by memory. Therefore, data compression has a broad utility in a wide range of computerized products beyond those mentioned here.

Compressed memory systems in prior art typically compress a memory page when it is created, either by reading it from disk or through memory allocation. Compression can be done using a variety of well-known methods by software routines or by hardware accelerators. When the processors request data from memory, data must typically be first decompressed before serving the requesting processor. As such requests may end up on the critical memory access path, decompression is typically hardware accelerated to impose a low impact on the memory access time.

In one compression approach, called deduplication, the idea is to identify identical memory objects. For example, let us assume that the memory contains five identical instances of the same page. Then, only one of them needs to be saved whereas the remaining four can make a reference to that only instance; thus, providing a compression ratio of a factor of five. Deduplication known in prior art has been applied to fixed-size objects at a range of granularities such as memory pages whose size are typically on the order of a few KiloBytes to tens of KiloBytes (KB), or even more, and memory blocks whose size are typically a few tens of bytes, for example 64 Bytes (64B). Other prior art considers variable-grain sizes such as variable-size storage files. In any case, a limitation of deduplication is that it builds on only removing duplicates of the occurrence of identical memory objects.

In removing identical objects, the removed object must establish a reference to the sole object identical to it. References, in terms of pointers, are to point to the sole copy of the memory object and this consumes memory space. Hence, deduplication can lead to significant compression meta-data overhead. For example, let us assume that deduplication is applied to memory blocks of 64B (=$2^6$ bytes) in a memory of 1 Terabyte=$2^{40}$ bytes. Then, a (40−6=) 34-bit reference pointer is needed to point to the unique copy of a deduplicated memory block.

Alternative compression approaches known from prior art leverage value redundancy (in terms of single words, say 32 or 64 bits). For example, a memory object that is more common than another will be encoded with fewer bits than a memory object that is not so common. As an example, Entropy-based compression techniques abound in prior art including for example Huffman coding and arithmetic coding. Other compression techniques include Base-Delta-Immediate compression that exploits that numerical values stored in data objects, e.g. memory pages and blocks, are numerically close to each other and encode the difference between them densely.

Importantly, deduplication, that removes duplicates and compression techniques exploiting value locality, such as entropy-based compression and base-delta-immediate compression, that remove value redundancy, are complementary in a number of ways. Consider for example page-based deduplication where a single copy of identical pages is stored whereas a reference pointer is provided from the copies to refer to the unique copy. Such a deduplication scheme does, however, not take advantage of the value redundancy existing at finer granularity, for example, at the word level (e.g. 32 or 64-bit entities) within the page. By combining deduplication with compression schemes that reduce value redundancy, it is possible to eliminate duplicates and store the remaining unique copies much denser by encoding each data value inside the unique copy based on its statistical value nature. It is the intent of this document to disclose an invention that provides devices, systems and methods of a family of compression techniques applied to computer memory that eliminates duplicates as well as value redundancy.

Combining deduplication with value-locality-based compression opens up a number of technical challenges. A first challenge is how to find an encoding that offers a combined gain in compressibility by removing duplicates as well as compressing the items in the remaining unique copies using a value-locality-based approach. To locate a memory block efficiently in the compressed memory, using a combined approach of deduplication and value-locality-based compression, will open up a challenge to keep the amount of metadata low and allow for compression and decompression devices to impose a low memory latency overhead. Hence, a second challenge is to come up with compression and decompression methods, devices and systems that can keep the amount of metadata low and that impose a low memory latency overhead. At operation, data objects will change in response to processor writes. This has the effect that the nature of duplicated and unique blocks will change; both concerning the number of duplicates as well as the statistical nature of the value locality of the remaining unique copies. A third challenge is to provide methods, devices and systems that can keep the compressibility high in light of such dynamic effects. It is the intent that the disclosed invention addresses all these and other challenges.

SUMMARY

A first aspect of the present invention is a computer memory compression method. The method comprises analyzing computer memory content with respect to occurrence of duplicate memory objects as well as value redundancy of data values in unique memory objects. The method also comprises encoding said computer memory content by eliminating said duplicate memory objects and compressing each remaining unique memory object by exploiting data value locality of the data values thereof. The method further comprises providing metadata representing the memory objects of the encoded computer memory content. The metadata reflects eliminated duplicate memory objects, remaining unique memory objects as well as a type of compression used for compressing each remaining unique memory object. The method moreover comprises and locating a memory object in the encoded computer memory content using said metadata.

A second aspect of the present invention is a computer memory compression device. The device comprises an analyzer unit configured for analyzing computer memory content with respect to occurrence of duplicate memory objects as well as value redundancy of data values in unique memory objects. The device also comprises an encoder unit configured for encoding said computer memory content by eliminating said duplicate memory objects and compressing each remaining unique memory object by exploiting data value locality of the data values thereof. The encoder unit is further being configured for providing metadata representing the memory objects of the encoded computer memory content. The metadata reflects eliminated duplicate memory objects, remaining unique memory objects as well as a type of compression used for compressing each remaining unique memory object. The device further comprises a locator unit configured for locating a memory object in the encoded computer memory content using said metadata.

Other aspects, as well as objectives, features and advantages of the disclosed embodiments will appear from the following detailed disclosure, from the attached dependent claims as well as from the drawings.

Generally, compressing by exploiting data value locality as described in this document may involve entropy-based encoding, delta encoding, dictionary-based encoding or pattern-based encoding, without limitations.

Generally, all terms used in the claims are to be interpreted according to their ordinary meaning in the technical field, unless explicitly defined otherwise herein. All references to "a/an/the [element, device, component, means, step, etc]" are to be interpreted openly as referring to at least one instance of the element, device, component, means, step, etc., unless explicitly stated otherwise. The steps of any method disclosed herein do not have to be performed in the exact order disclosed, unless explicitly stated.

DESCRIPTION OF DRAWINGS

FIG. 12 depicts a general flowchart of a computer memory compression method.

DETAILED TECHNICAL DESCRIPTION

This document discloses systems, methods and devices to compress data in computer memory with a family of compression approaches that eliminates duplicates and value redundancy in computer memories.

Figure 1:
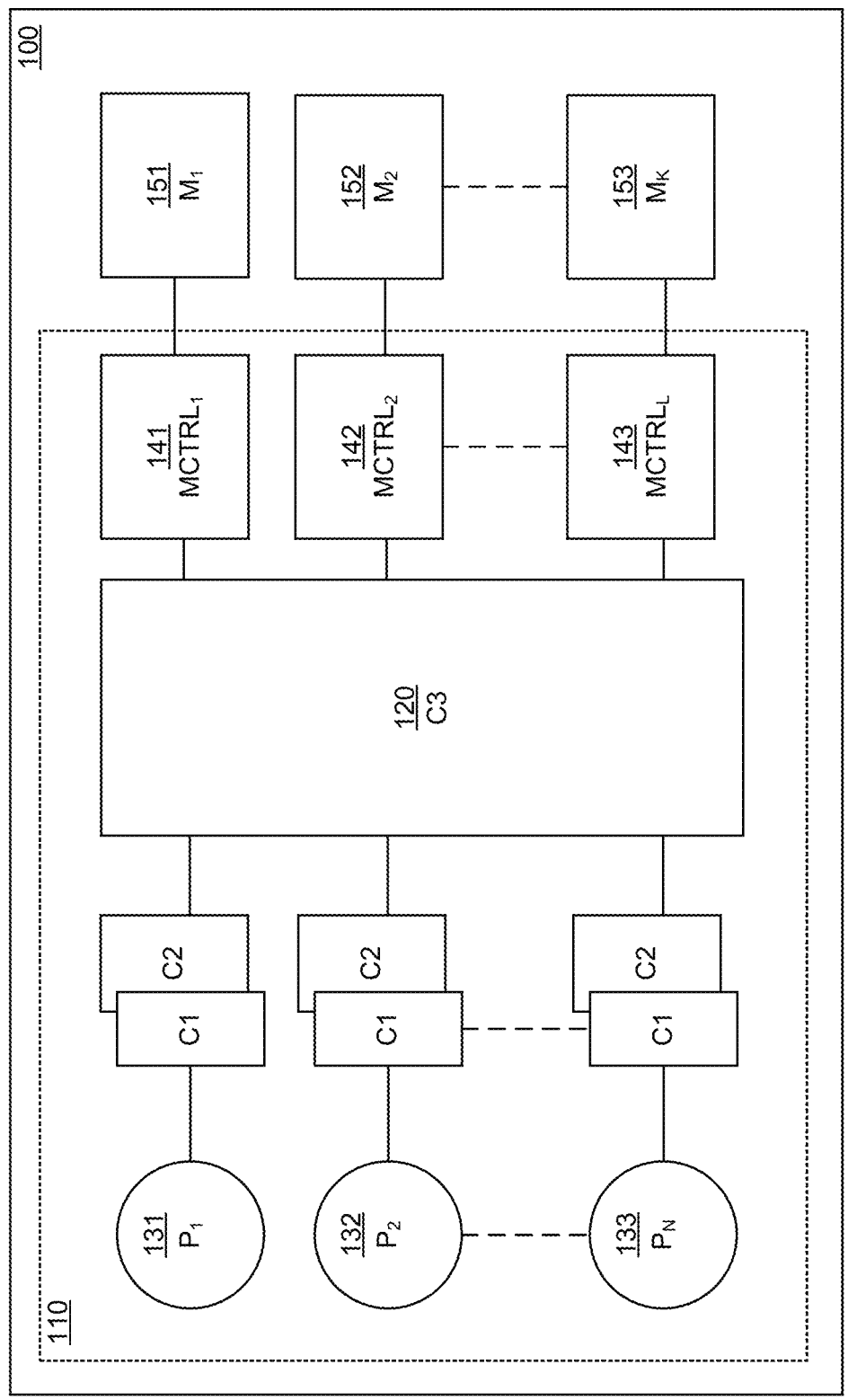
FIG. 1 depicts a computer system comprising a microprocessor chip with one or a plurality of processing units, an exemplary cache hierarchy of three levels, one or a plurality of memory controllers connected to one or a plurality of off-chip memories.

An exemplary embodiment of a computer system 100 is depicted in FIG. 1. This system comprises a microprocessor chip 110 and one or a plurality of memory modules denoted $M_1$ 151, $M_2$ 152 through $M_K$ 153. The microprocessor chip could be a discrete system or integrated on a system-on-a-chip (SoC) in any available technology. The microprocessor 110 comprises one or several processing units, denoted $P_1$ 131, $P_2$ 132 through $P_N$ 133 sometimes called CPU or core and a memory hierarchy. The memory hierarchy, on the other hand, comprises several cache levels, e.g. three levels as is shown exemplary in FIG. 1 and denoted C1, C2, and C3. These levels can be implemented in the same or different memory technologies, e.g. SRAM, DRAM, or any type of non-volatile technology including for example Phase-Change Memory (PCM). The number of cache levels may vary in different embodiments and the exemplary embodiment 100 depicts three levels where the last cache level is C3 120. These levels are connected using some kind of interconnection means (e.g. bus or any other interconnection network). In the exemplary embodiment, levels C1 and C2 are private to, and only accessible by, a respective processing unit i denoted $P_i$ (e.g. $P_1$ in FIG. 1). It is well known to someone skilled in the art that alternative embodiments can have any number of private cache levels or, as an alternative, all cache levels are shared as illustrated by the third level C3 120 in FIG. 1. Regarding the inclusion of the data in the cache hierarchy, any embodiment is possible and can be appreciated by someone skilled in the art. For example, C1 can be included in C2 whereas C2 can be non-inclusive with respect to level C3. Someone skilled in the art can appreciate alternative embodiments. The computer system 100 of FIG. 1 comprises one or a plurality of memory controllers, denoted $MCTRL_1$ 141, $MCTRL_2$ 142, through $MCTRL_L$ 143. The last cache level (C3 in FIG. 1) is connected to the memory controllers, which in turn are connected to one or a plurality of memory modules. Memory controllers can be integrated on the microprocessor chip 110 or can be implemented outside the microprocessor chip. Finally, a computer system runs one or more tasks. A task can be any software application or part of it that can run on the particular system.

Computer systems, as exemplified by the embodiment in FIG. 1, can suffer from a limited capacity of the memories denoted $M_1$ 151 through $M_K$ 153 and of the cache memories, regardless of level (e.g. C1, C2 and C3 in FIG. 1). A limited cache capacity can manifest itself as a higher fraction of memory requests having to be serviced at the next level in the memory hierarchy leading to losses in performance or higher energy consumption. To mitigate this problem, one can consider increasing cache capacity, thereby lowering the number of requests that need to be serviced by the next level of the memory hierarchy. Increasing the capacity of the cache levels on a microprocessor chip will lead to a number of problems. First, the cache access request time can increase leading to performance losses. Second, the energy consumed on an access request to a larger cache can potentially be higher. Third, using up more of the silicon or equivalent material on the microprocessor chip to realize larger cache levels may have to be traded for less processing capabilities. It is therefore desirable to realize more cache capacity without the problems identified above. A limited memory capacity has similar problems and can manifest itself in more memory requests that will have to be serviced at the next level of the memory hierarchy typically realized as the storage level of the memory hierarchy. Such storage-level accesses are slower and may result in considerable losses in performance and energy expenditure. Increasing the memory capacity can mitigate these drawbacks. However, more memory capacity can increase the cost of the computer system both at the component level or in terms of energy expenditure. In addition, more memory consumes more space, which may limit the utility of the computer system in particular in form-factor constrained products including for example mobile computers (e.g., tablets, smart phones, wearables and small computerized devices connected to the Internet).

This invention disclosure considers several embodiments that differ at which level of the aforementioned exemplary memory hierarchy compression is applied. A first embodiment considers the invented compression method being applied at the main memory. However, other embodiments can be appreciated by someone skilled in the art. It is the intent that such embodiments are also contemplated while not being explicitly covered in this patent disclosure.

Figure 2:
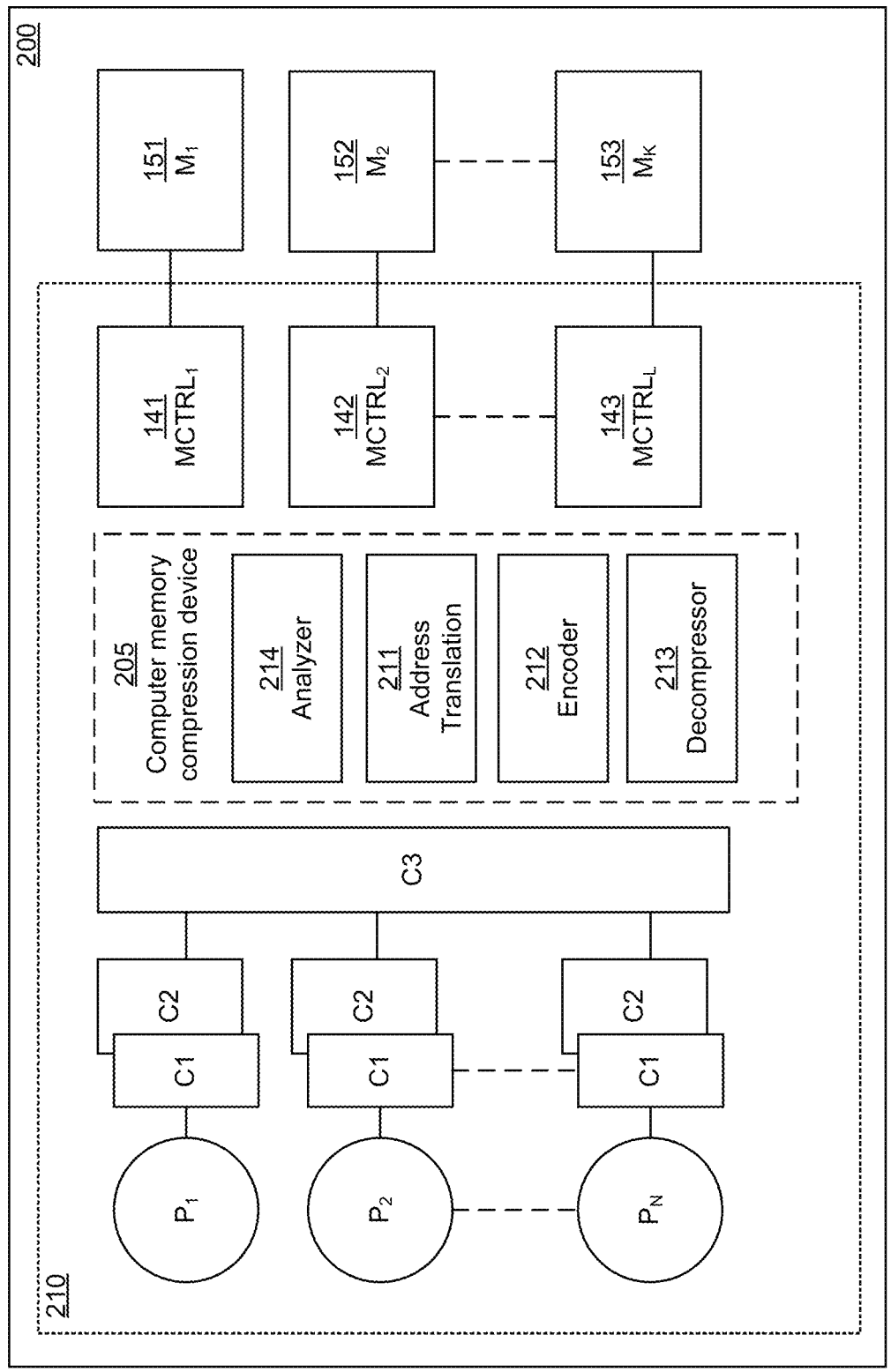
FIG. 2 depicts a computer system, such as in FIG. 1 configured for compressing data and instructions in memory.

As for the first disclosed embodiment, where we consider the problem of a limited main memory capacity, the exemplary system in FIG. 1 can be configured to allow data and instructions to be compressed in main memory. FIG. 2 shows an example of such a computer system 200. What has been added is a computer memory compression device 205 on the microprocessor chip 210. The computer memory compression device 205 comprises four functional blocks. These blocks comprise a locator (address translation) unit 211, an encoder (compressor) unit 212, a decompressor unit 213 and an analyzer unit 214.

As will be explained in more detail below, the analyzer unit 214 is configured for analyzing computer memory content with respect to occurrence of duplicate memory objects as well as value redundancy of data values in unique memory objects. In this regards, the data values will typically be of finer granularity than the memory objects, and the memory objects will typically be of finer granularity than the computer memory content. The computer memory content may typically be a page of computer memory, the memory objects may typically be memory blocks, and each memory block may typically comprise a plurality of data values, such as memory words.

The encoder unit 212 is configured for encoding the computer memory content by eliminating the duplicate memory objects and compressing each remaining unique memory object by exploiting data value locality of the data values thereof. The encoder unit 212 is further configured for providing metadata representing the memory objects of the encoded computer memory content. The metadata reflects eliminated duplicate memory objects, remaining unique memory objects as well as a type of compression used for compressing each remaining unique memory object. Examples of such metadata are, for instance, seen at 500 in FIG. 5. The locator unit 211 is configured for locating a memory object in the encoded computer memory content using the metadata.

A corresponding general computer memory compression method 1200 is shown in FIG. 12. The method involves analyzing 1210 computer memory content with respect to occurrence of duplicate memory objects as well as value redundancy of data values in unique memory objects. The method further involves encoding 1220 the computer memory content by eliminating the duplicate memory objects and compressing each remaining unique memory object by exploiting data value locality of the data values thereof. The method also involves providing 1230 metadata 500 representing the memory objects of the encoded computer memory content. The method moreover involves locating 1240 a memory object in the encoded computer memory content using the metadata 500. The computer memory compression method 1200 may generally comprise functional steps corresponding to functionality performed by any or all of the structural features and embodiments of the computer memory compression device 205 as described throughout this document.

The computer memory compression device 205 is connected to the memory controllers on one side and the last-level cache C3 on the other side. A purpose of the address translation unit 211 is to translate a conventional physical address PA to a compressed address CA to locate a memory block in the compressed memory. Someone skilled in the art realizes that such address translation is needed because a conventional memory page (say 4KB) may be compressed to any size in a compressed memory. A purpose of the encoder (compressor) unit 212 is to compress memory blocks that have been modified and are evicted from the last-level cache. To have a negligible impact on the performance of the memory system, compression must be fast and is typically accelerated by a dedicated compressor unit. Similarly, when a memory block is requested by the processor and is not available in any of the cache levels, e.g. C1, C2 and C3 in the exemplary embodiment, the memory block must be requested from memory. The address translation unit 211 will locate the block but before it is installed in the cache hierarchy, e.g. in C1, it must be decompressed. A purpose of the decompressor unit 213 is to accelerate this process so that it can have negligible impact on the performance of the memory system.

Someone skilled in the art may realize that the functionality of the compressor and the decompressor unit depends on the type of compression algorithm being used. In one embodiment, delta encoding (such as base-delta-immediate encoding) can be used, where the difference between a value and a base value is stored rather than the value itself. In another embodiment, entropy-based encoding (such as Huffman-encoding) can be used in which values that are more frequent than others use denser codes. In a third embodiment, one can use deduplication where only unique blocks are stored in memory. It is the intent of this invention disclosure to cover all compression algorithms with the purpose of removing value redundancy.

Given the embodiment according to FIG. 2, the rest of the document follows the structure of providing devices, methods and systems using a combined compression approach based on deduplication and value-redundancy removal compression with respect to how to encode computer memory content (e.g. memory pages); how to locate memory objects (e.g. memory blocks) in the compressed memory; how to compress and decompress individual memory objects (e.g. memory blocks) and finally, how to recompress computer memory content (e.g. memory pages) to remove additional duplicates and value redundancy.

Data Analysis and Encoding of Memory Pages

Figure 3:
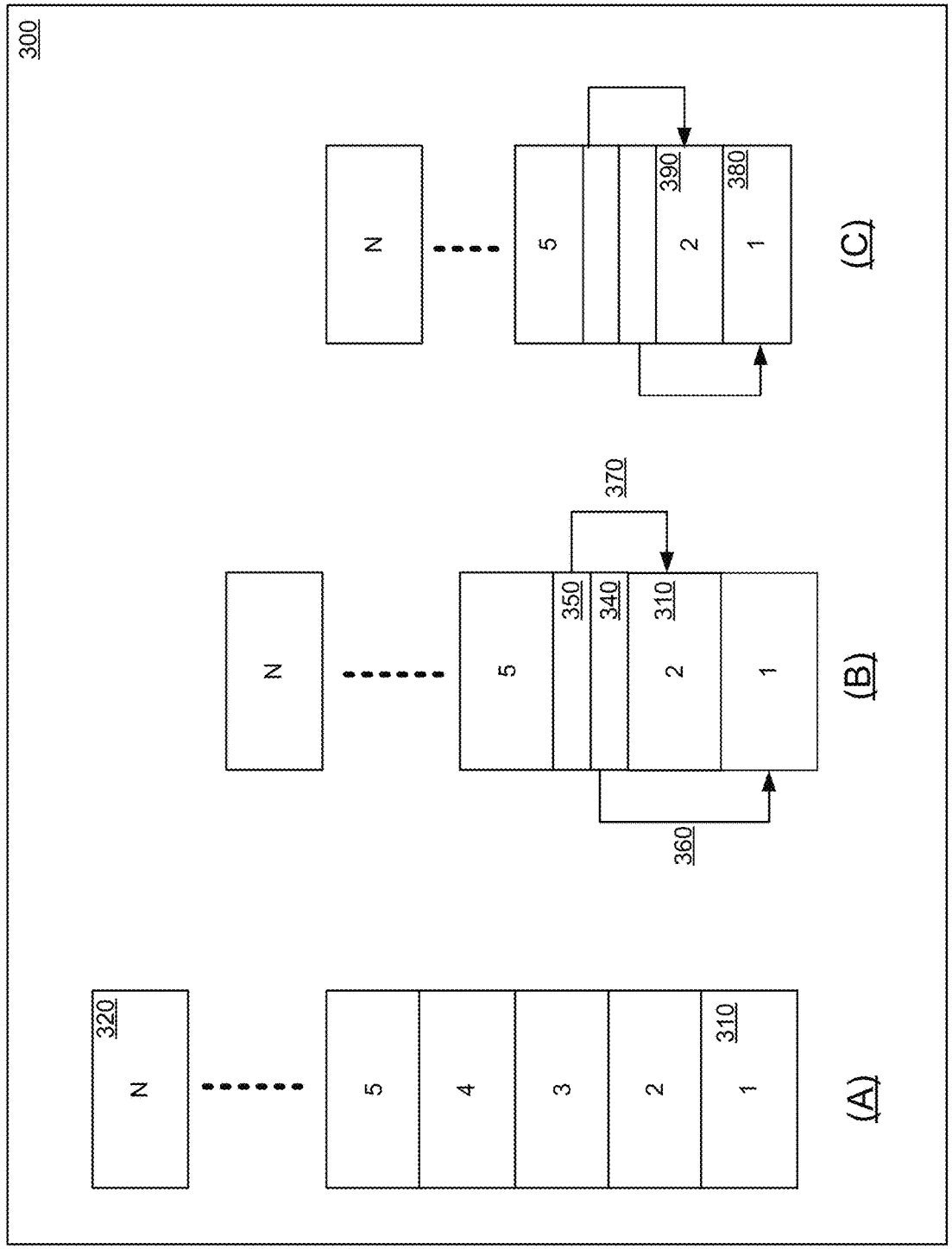
FIG. 3 depicts an exemplary memory page layout before and after applying deduplication and value-redundancy elimination compression methods.

We provide an exemplary overview of how a memory page is compressed using deduplication in combination with entropy-based compression in FIG. 3. Note, however, that other value-redundancy removal compression methods, such as delta encoding (e.g. base-delta-immediate encoding) are possible. The exemplary layout 300 of a page comprises N blocks as shown to the left in FIG. 3 at (A), numbered 1, 2, . . . , N and appearing at consecutive memory block addresses in a conventional uncompressed computer memory, where 310 represents the first memory block and 320 the last memory block. Deduplication aims at removing duplicated blocks so that only unique blocks belong to the memory page. In the exemplary layout 300 of memory blocks in a page, shown in the middle of FIG. 3 at (B), memory blocks represented by 340 and 350 are duplicates. Instead of storing the duplicated data in memory, and as will be explained in detail later, they only store references, e.g. pointers, to the unique blocks. The memory block 350 uses the pointer marked 370 to refer to memory block 2 (330). Similarly, the memory block 340 uses the pointer depicted 360 to refer to memory block 1. Hence, after the deduplication process, the memory page contains only memory blocks with distinct content, referred to as unique memory blocks.

Prior art also comprises compression methods that encode frequently used data denser than less frequently used data, such as Huffman encoding, or that exploit that numerical values are similar, such as delta encoding (e.g. base-delta-immediate encoding). These compression methods are referred to as value-redundancy removal compression methods. To compress a page, using a value-redundancy removal compression method, one typically analyzes all individual data items at some granularity, for example, at the word level (say 64 bits). The value frequency distribution would capture the relative occurrence of different values in the page. However, when trivially applied to the original content of the memory page, before deduplication, the existence of duplicates can drastically change the value distribution. For this reason, the proposed embodiment applies deduplication first, to remove duplicates, before value distribution of the remaining unique memory blocks is established. The rightmost exemplary layout, seen at (C) in FIG. 3, shows the result after having applied value-redundancy removal compression. The size of the unique memory blocks denoted 1 (380) and 2 (390) can now be smaller, because value-redundancy removal compression can have managed to code more frequent data items denser than less frequent ones.

Figure 4:
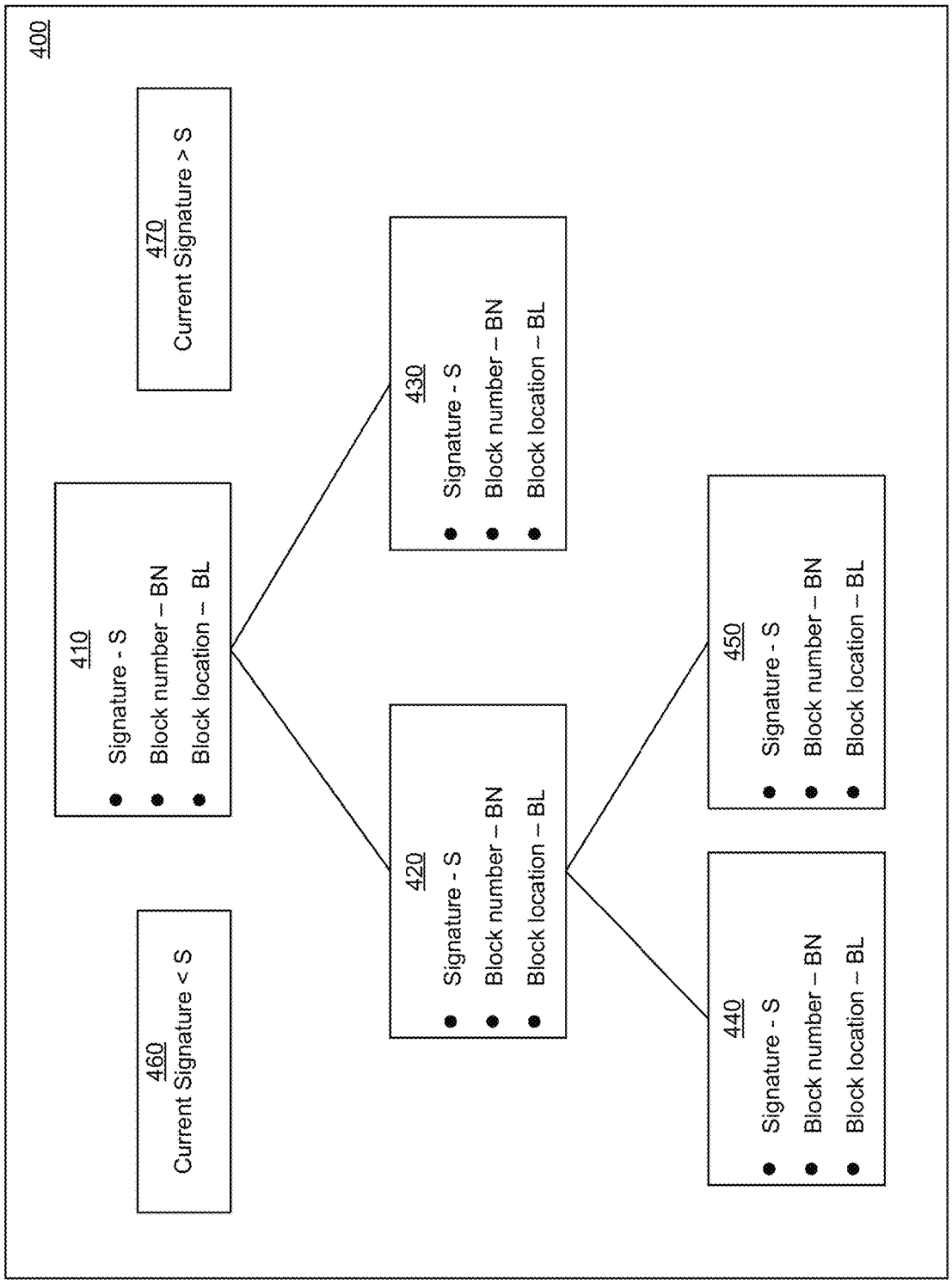
FIG. 4 depicts an exemplary layout of a tree-based data structure to keep track of unique blocks within a page.

We now turn our attention to how the combined approach is realized as exemplified in FIG. 3. This is explained in relation to FIG. 4-7. As explained in preceding paragraphs, to realize the full potential of value-redundancy removal compression in combination with deduplication, it is important to do deduplication first. In one embodiment, deduplication can be realized by sequentially analyzing all of the memory blocks in a single page, not excluding the possibility to consider all of the memory blocks in multiple pages, with the goal of establishing whether it is unique or not. To this end, the first memory block to be analyzed will be always classified as unique. Turning the attention to FIG. 4, an exemplary tree data structure 400 records all unique blocks. Before a block is inserted, a signature of the block, known from prior art, is created. A signature is a dense representation of the value of a block with the property that if the signatures of two memory blocks are different, they are not identical. The opposite, however, may not hold.

To establish whether a memory block is unique and must be inserted in the tree-based data structure, its signature is first compared with the signature of the top node 410 in the tree data structure 400. If it is the same, a second test is carried out to compare the content of the two memory blocks. If the memory blocks are indeed identical, a duplicate block has been detected. This same operation is carried out at each node in the tree-based data structure. However, if the signature is the same, but the two blocks are not identical, the new block has to be inserted with the same signature. This may involve the following additional test to handle false positives. When the created signature S matches 650 a signature represented in the tree data structure 400:

determining whether said individual memory object is identical to said unique memory block represented by said matching signature; and if said individual memory object and said unique memory block represented by said matching signature are not identical:

inserting a node in the tree data structure 400;

entering the created signature S in the inserted node; and generating the metadata 500 for said individual memory object with the information 510 indicating that it is a unique memory object and the unique memory object reference 530, U PTR to said individual memory object.

On the other hand, if there is a signature mismatch, the search proceeds in the left branch of the tree if the signature is less than that of the top node 410 according to the test at 460. If the signature is greater than the signature of the top node, the search proceeds in the right branch of the tree according to the test (box 470). Hence, all nodes 410, 420, 430, 440 and 450 are organized in descending order (left branch) and ascending order (right branch) to make the search time logarithmic rather than linear. As duplicates will be removed in the process, a memory block will not reside at the same address as in a conventional uncompressed page. For this reason, the new location of a block will be recorded in the tree-based data structure as depicted in each node by "Block location—BL".

The end result of the deduplication process is that all duplicated memory blocks have been eliminated. For this reason, and as has been explained in relation to FIG. 3, a memory block may not reside at the same location in a deduplicated page as in the original not deduplicated page. For this reason, to aid in how to locate a memory block in the compressed memory, to be further elaborated on later, metadata must be generated in the deduplication process.

Figure 5:
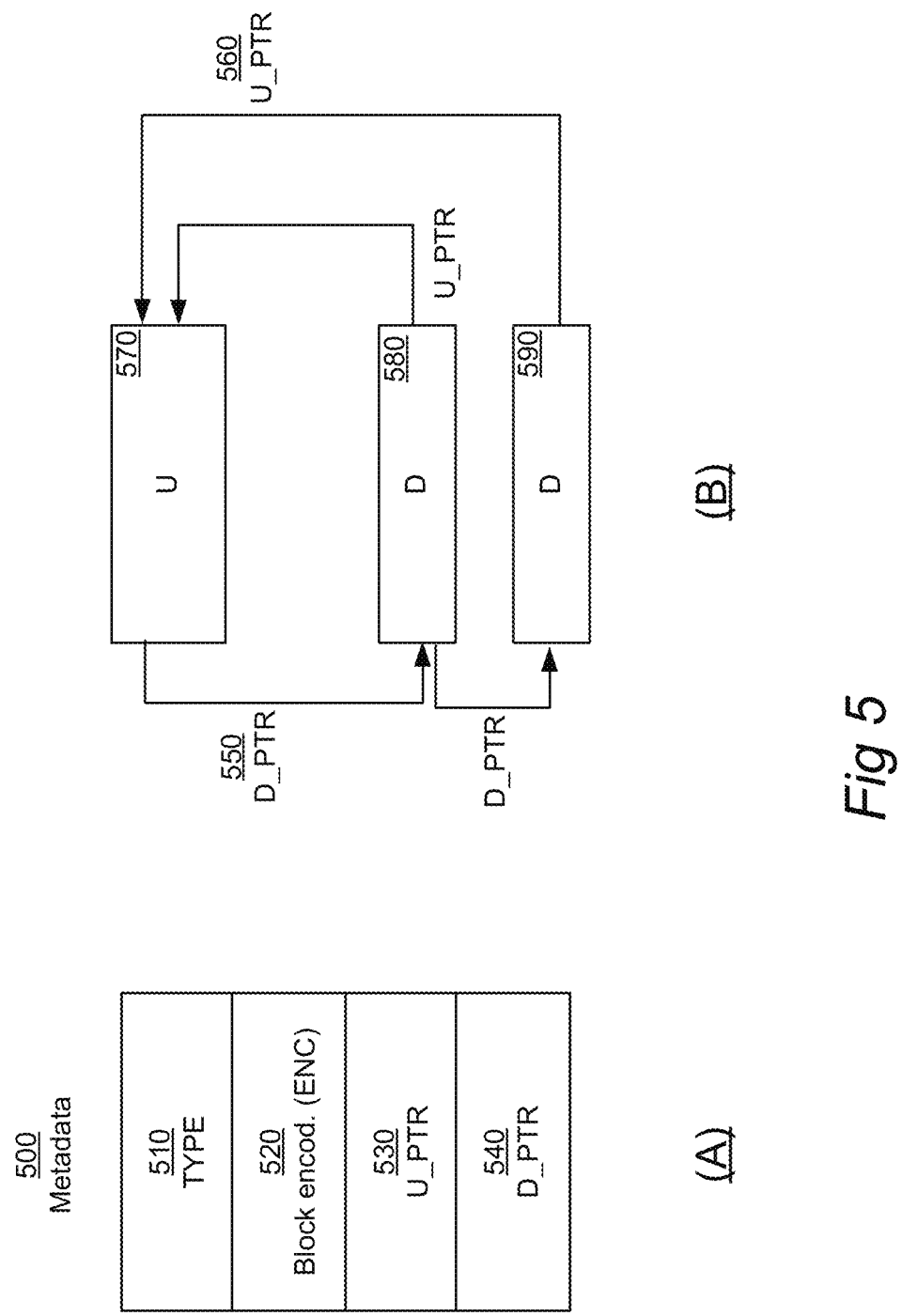
FIG. 5 depicts the metadata structure to compress memory pages using a combination of deduplication and other compression methods and example of its use.

FIG. 5, to the left at (A), shows exemplary metadata 500 generated in the process for each memory block. Metadata 500 comprises four components: TYPE (510), Block encoding—NC (520), U_PTR (530) and D_PTR (540). TYPE depicts whether a block is unique or a duplicate. Block encoding, denoted ENC, denotes the type of compression algorithm applied to the memory block content, e.g. Huffman or arithmetic coding or other. If the memory block is unique, a pointer to locate it is needed. This is represented by U_PTR (530). On the other hand, if a block is a duplicate, a pointer is needed to the unique copy. As with the unique copy, U_PTR (530) points to the unique copy in the compressed memory.

The rightmost part of FIG. 5, at (B), depicts an exemplary layout of three selected memory blocks in a page where the memory block 570 is unique and the memory blocks 580 and 590 are duplicates of the memory block 570. Here, the U_PTRs of the duplicates point to the unique memory block 570. However, in operation it may happen that the unique block becomes modified. Then it may not contain the same content as the duplicated blocks according to boxes 580 and 590. For this reason, there is a need to track duplicates from the perspective of the unique memory block. To this end, pointers denoted D_PTR are provided. They establish a linked data structure linking all duplicated memory blocks together with the corresponding unique memory block. In the example, D_PTR (550) of the unique memory block 570 points to the duplicated memory block 580. The D_PTR of the duplicated memory block box 580 points to the other duplicated memory block 590.

Hence, in summary, the metadata 500 advantageously comprises, for each memory object of the encoded computer memory content:
  information 510 indicative of the memory object being an eliminated duplicate memory object or a remaining unique memory object;
  when the memory object is a unique memory object, information 520 indicative of the type of compression used and a unique memory object reference 530, U_PTR to the unique memory object; and
  when the memory object is a duplicate memory object, a unique memory object reference 530, U_PTR to a unique memory object, the non-compressed contents of which are identical to the duplicate memory object.

Advantageously, the metadata 500 further comprises, for each memory object being a unique memory object, a duplicate memory object reference 540, D_PTR to an eliminated duplicate memory object, the non-compressed contents of which are identical to the unique memory object.

Let us now establish the entire process by which memory blocks become deduplicated by analyzing all the memory blocks within a page (other granularities such as multiple pages are also applicable). The process is depicted in the flow graph of FIG. 6. As already mentioned in relation to FIG. 4, the process 600 of deduplicating memory blocks uses a tree-based data structure 400 that will eventually contain all the unique memory blocks. The process 600 will analyze all memory blocks of a page, in a sequential fashion. A first decision step 620 checks whether all memory blocks of the page have been visited. If not, the next memory block is considered. As has been explained in relation to FIG. 4, the signature of that block is created according to some method known in prior art as such, and the signature is compared against all the nodes in the tree for as long as a match is not detected. In the end, there are two outcomes. If the block is unique, as tested in the decision step 640, it will be inserted at 660. Then, the memory block location is recorded along with the memory block number within the page. If the block is not unique, it is deduplicated at 650, and a pointer to the block location of the unique block already recorded in the tree-based data structure will be assigned to the U_PTR pointer of the metadata according to FIG. 5 (see 530). Regardless of the outcome, the next action is to analyze the next memory block of the page, taking us back to decision step 620.

Figure 6:
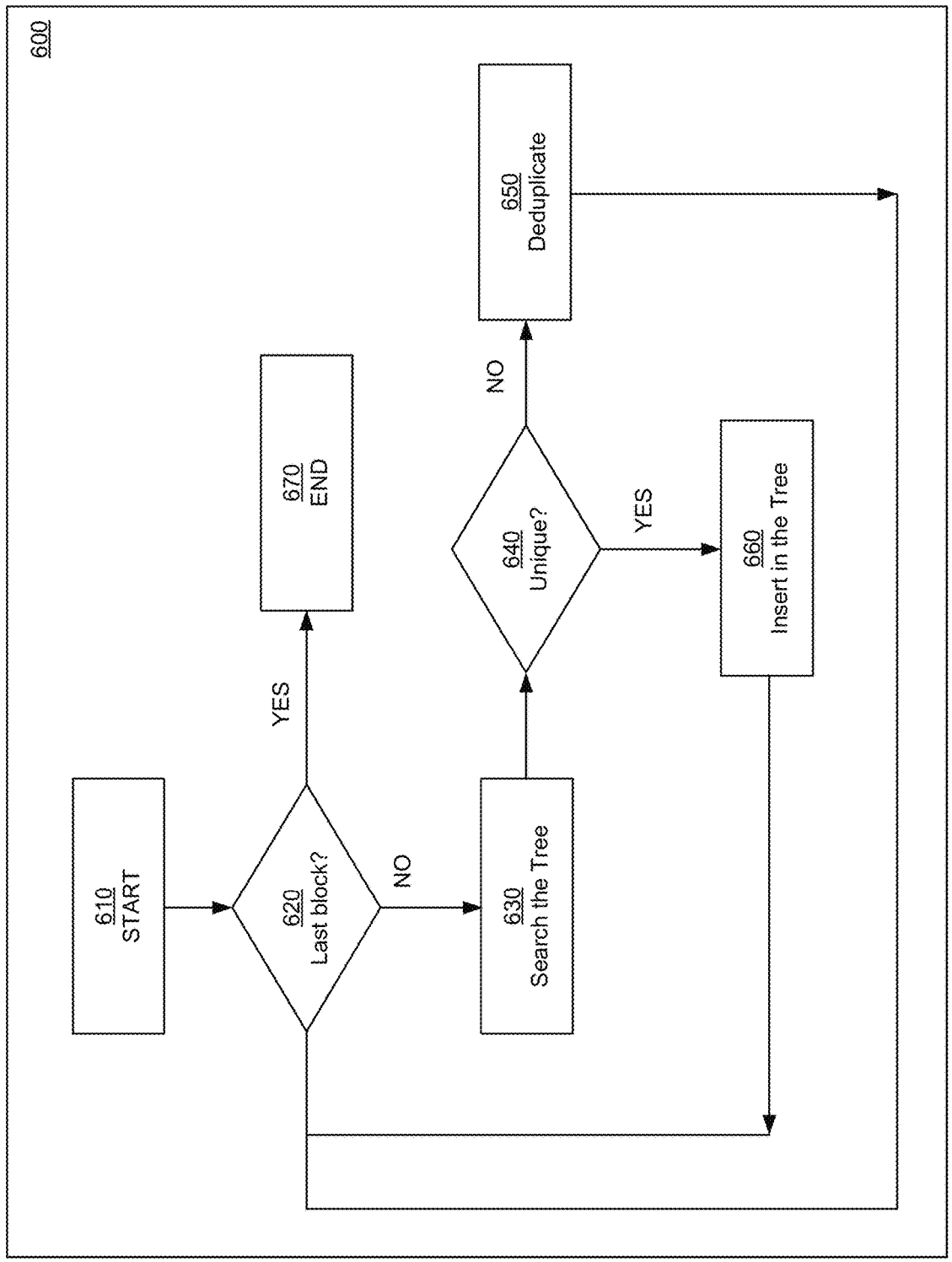
FIG. 6 depicts a flow graph of the deduplication process.

As will be understood from the description of FIG. 4 to FIG. 6, the analyzer unit 214 and the encoder unit 212 of the computer memory compression device 205 are hence configured for processing 600 each individual memory object in the computer memory content by:
  creating the signature S, the signature being a dense representation of the data values of the memory object;
  traversing the tree data structure 400 to compare the created signature S to signatures already represented in the tree data structure 400;
  if the created signature S does not match 660 any of the signatures represented in the tree data structure 400:
    inserting a node in the tree data structure 400;
    entering the created signature S in the inserted node; and
    generating the metadata 500 for said individual memory object with the information 510 indicating that it is a unique memory object and the unique memory object reference 530, U_PTR to the individual memory object; and
  if the created signature S matches 650 a signature represented in the tree data structure 400:
    generating the metadata 500 for said individual memory object with the information 510 indicating that it is a duplicate memory object and the unique memory object reference 530, U_PTR to a unique memory block represented by the matching signature in the tree data structure 400; and
    updating the metadata 500 of the unique memory block represented by the matching signature in the tree data structure 400 to introduce a duplicate memory object reference 540, D_PTR to said individual memory object.

Figure 7:
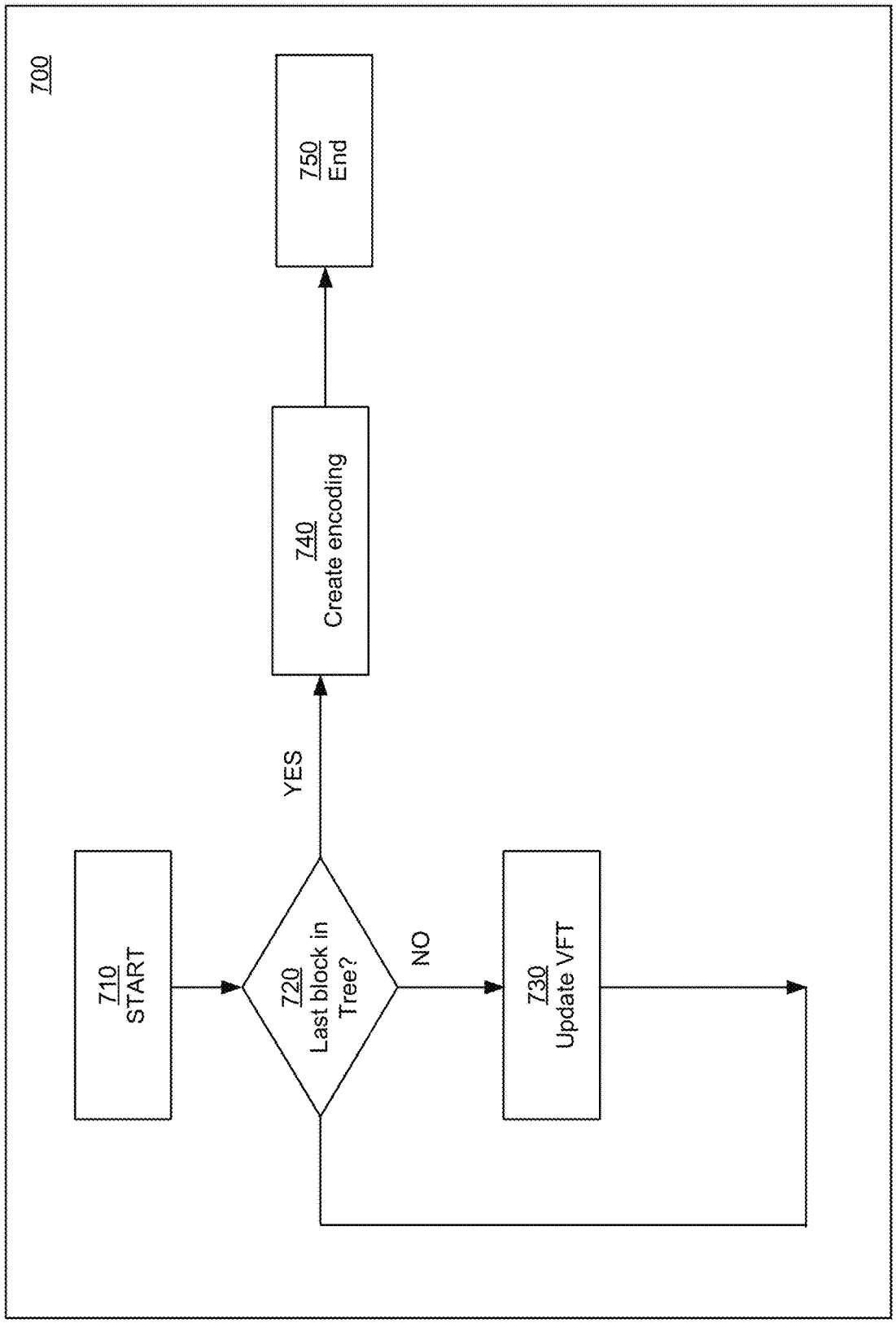
FIG. 7 depicts a flow graph of value-redundancy removal compression methods.

As has been pointed out, applying deduplication prior to any compression method aiming at leveraging on the value locality of individual data items, for example at the word level, is important as duplicates will not represent the value frequency distribution correctly. To this end, a process is needed to establish the value frequency distribution of unique blocks. Such a process 700 is depicted in FIG. 7. The overall process 700 aims at analyzing all unique memory blocks which are recorded in the tree-based data structure 400 of FIG. 4. The process 700 starts at step 710. For as long as all unique memory blocks have not been visited (step 720), the process 700 records the value frequency of each visited unique block. This can be done by recording the frequency of each individual value in a hash table, at step 730. In the end, the value frequency of all unique memory blocks can be established, and an encoding based on any value-locality-based compression method, such as Huffman or arithmetic coding or others, can be established in step 740.

The analyzer unit 214 and the encoder unit 212 of the computer memory compression device 205 may hence be configured for, when all memory objects in the computer memory content have been processed 600:

traversing the tree data structure 400 to generate a value-frequency table for the data values of the unique memory objects as represented by the nodes of the tree data structure 400; and compressing each unique memory object by an entropy-based compression scheme using the generated value frequency table.

In one such embodiment, the analyzer unit could implement a hash-table to record the frequency of each value to be used for later analysis, perhaps using software routines, to establish encodings using e.g. Huffman encoding or some other entropy-based encoding techniques.

In an alternative embodiment, using delta encoding (e.g. base-delta-immediate encoding), the values remaining after duplicates have been removed can be used to select one or a plurality of base values. In one approach, clustering techniques can be used to analyze which base value is closest to all values in the unique copies in a page, after duplicates have been removed.

Alternatively, therefore, the analyzer unit 214 and the encoder unit 212 of the computer memory compression device 205 may be configured for, when all memory objects in the computer memory content have been processed 600:

traversing the tree data structure 400 to generate a value frequency table for the data values of the unique memory objects as represented by the nodes of the tree data structure 400; and compressing each unique memory object by an entropy-based compression scheme using the generated value frequency table.

Locating Memory Blocks in Compressed Memory

Figure 10:
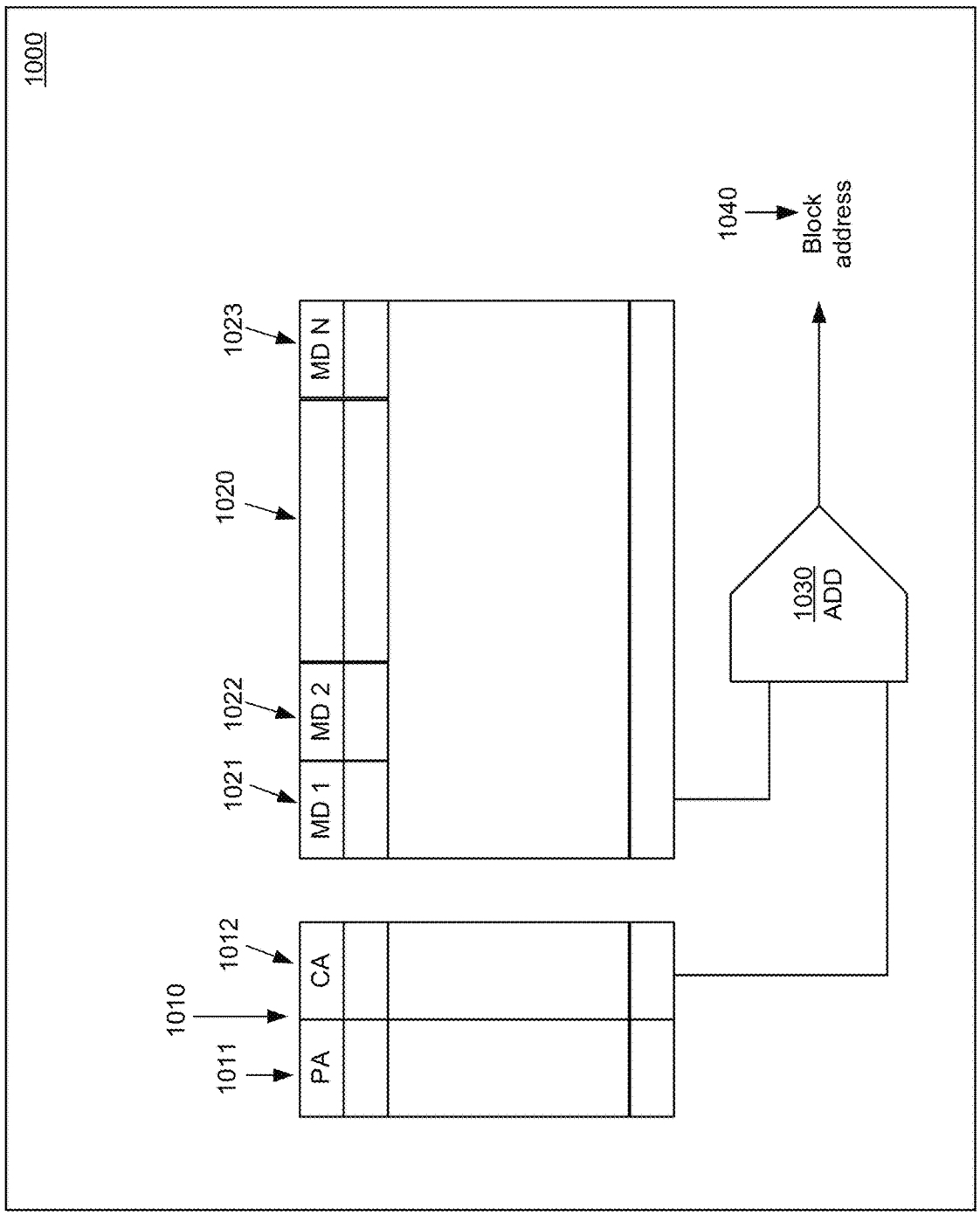
FIG. 10 depicts an address translation unit to establish the location of a memory block using deduplication and value-redundancy removal compression methods.

We now turn our attention to how a memory block is located and decompressed in the compressed memory using the combined deduplication and value-redundancy removal compression technique. Returning to FIG. 2, recall that a task of the locator (address translation) unit 211 is to translate a conventional physical address to an address in the compressed address space. FIG. 10 shows a detailed layout 1000 of the locator (address translation) unit 211 of FIG. 2. It comprises a number of page entries where each entry 1010 comprises a number of fields: The Physical Address (PA) 1011 and the Compressed Address (CA) 1012, which correspond to the physical and the compressed address of a page, respectively. As seen at 1021-1023 in FIG. 5, each page entry is associated with metadata MD 1 . . . MD N for each block. For details of the metadata, please refer to the leftmost part (A) of FIG. 5, as previously described. As shown in FIG. 5, regardless of whether the memory block is unique or deduplicated, the U_PTR acts as an offset to the location of the block relative to the compressed address CA. An adder 1030 forms a block address 1040 by establishing the sum of the U_PTR and the compressed address CA 1012.

When one of the processors in FIG. 2 (denoted $P_1$ through $P_N$) issues a read request that cannot be satisfied by any of the levels of caches ($C_1$, $C_2$ or $C_3$) it will be taken care of by the locator (address translation) unit 211/1000 in FIGS. 2/10, and the physical address PA will be translated according to the process explained above using the compressed address CA associated with PA along with the metadata of the requested block. However, if a write request cannot be satisfied by any of the levels of caches, that write can affect which blocks are unique and which blocks are deduplicated. Consider the scenario in the leftmost part of FIG. 8 at (A). Here, a unique block is represented by 830. Two deduplicated blocks represented by 810 and 820 have the same content, and their U_PTRs point to the unique block 830. The deduplicated memory blocks 810, 820 are linked to the unique block 830 by having the unique block's D_PTR point at the memory block 820, and that same block's D_PTR points at the memory block 810.

Figure 8:
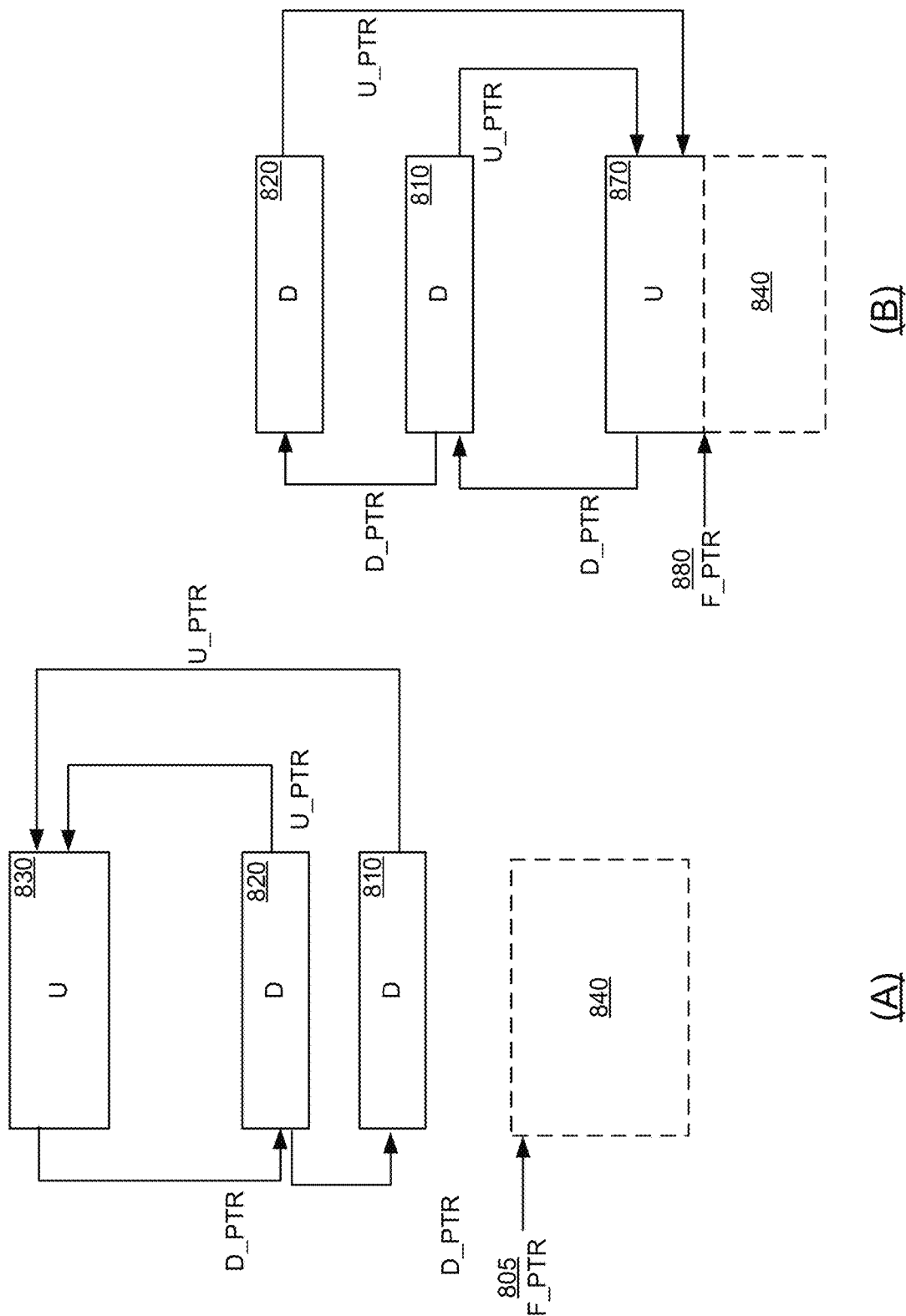
FIG. 8 depicts the change of an exemplary memory in response to a modification of a unique memory block.

Now suppose that a write request is destined to the unique memory block 830 and let us turn our attention to the rightmost scenario of FIG. 8 at (B). Since there exist duplicates of the unique memory block 830, it can be desirable to keep that memory block. This is done using a dedicated free memory area, represented by 840 in FIG. 8, that is possibly, but not necessarily, within the page, to copy the old content of the unique memory block 830. The current starting address 805 of that free memory area is pointed at by a reference, e.g. dedicated pointer, denoted F_PTR. The old content of the unique memory block 830 is copied to the free area 840, as seen at 870, and the U_PTRs of the deduplicated memory blocks 810, 820 now point at the old unique memory block, now residing at 870. In addition, the D_PTRs are changed to link the deduplicated memory blocks 810, 820 to the old unique memory block residing at 870. Alternatively, only the D_PTR of block 870 is updated to point to block 820, whereas the rest of D_PTR remain as seen in the leftmost part (A) of FIG. 8—i.e. only the linked list's head is updated. The unique memory block residing at the original place, i.e. 830, can now be updated with the new contents in accordance with the write request. The F_PTR is also updated to reflect the changed starting address of the free memory area, as seen at 880.

An alternative way of handling a write request destined to the unique memory block 830 in FIG. 8 is as follows. Please notice, however, that the detailed contents of FIG. 8 do not reflect the following description. The deduplicated memory block 820 is promoted as unique in the tree data structure 400 (cf FIG. 4) by using the signature S of the unique memory block 830. The updated contents of the unique memory block 830 according to the write request is written to the dedicated free memory area 840. The U_PTR of 830 is updated to point to where the new block is in the free memory area, the D_PTR of 830 is removed or, at least, updated to not point anywhere as block 830 is a unique block with no detected duplicates. The F_PTR is updated to reflect a new starting address after the writing.

Figure 9:
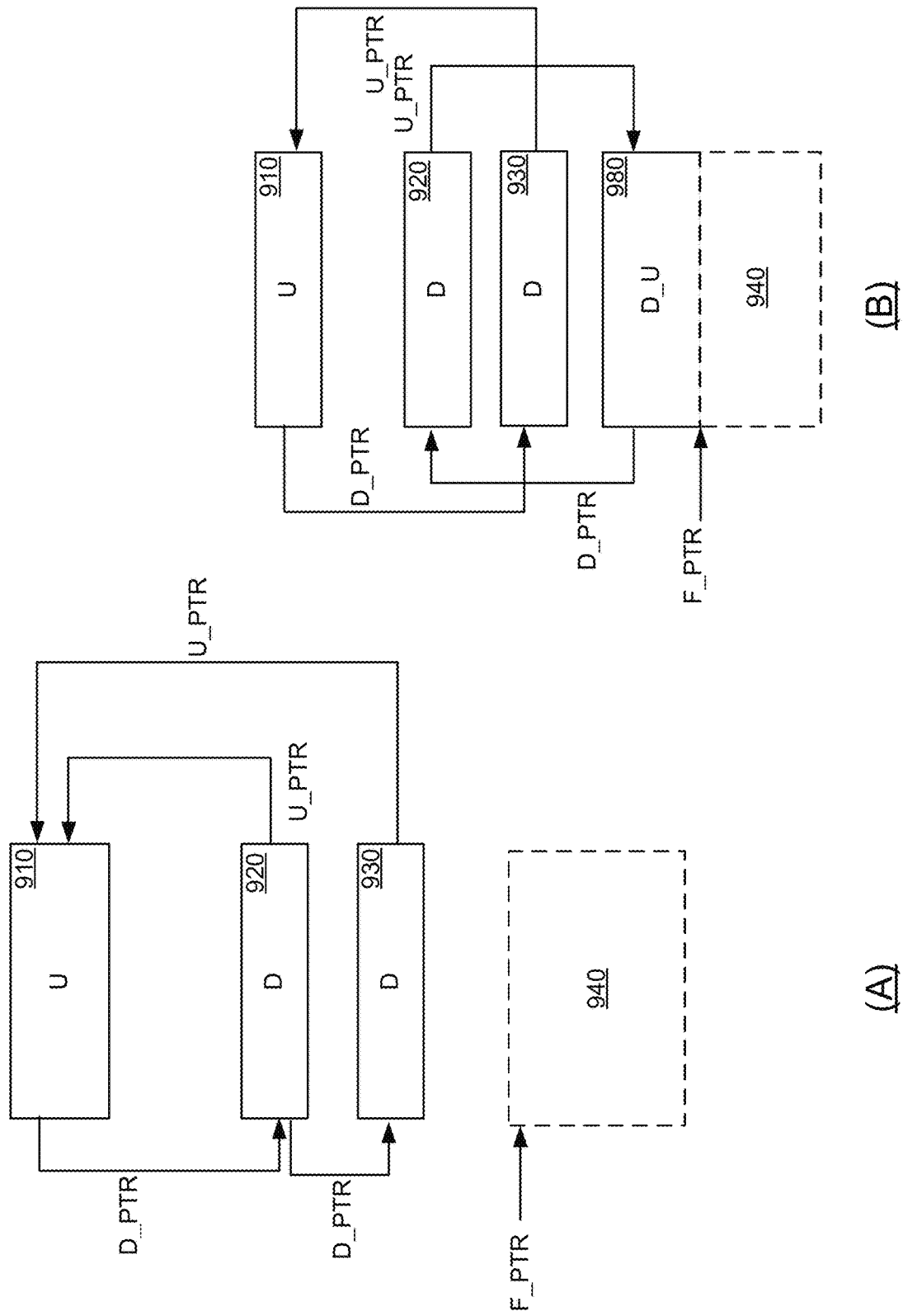
FIG. 9 depicts the change of an exemplary memory in response to a modification of a deduplicated memory block.

Let us now consider a scenario where a write request is destined to a deduplicated block and let us turn our attention to the leftmost scenario of FIG. 9. Here, there are two deduplicated memory blocks 920 and 930 with the same content as the unique memory block 910, and the U_PTRs and D_PTRs are set up to reflect this case as explained in the previous paragraphs. Now, assume that a write request is destined to the deduplicated block 920 of the leftmost scenario. Since the content of the deduplicated block will now change, its content will not be identical with the unique memory block 910. Instead, the updated deduplicated block will now be placed in the free area at 980 and is denoted D_U. The U_PTR of block 920 is now changed to point at the new unique block 980, and that block's D_PTR points to the deduplicated block 920. In addition, the D_PTR that linked the previously deduplicated block to the unique block 910 is now changed to point at the other deduplicated block 930 and that block's 930 U_PTR points at the unique block 910.

Note that in both the scenarios of FIG. 8 and FIG. 9, the write operations will create new block contents that may or may not exist already. In the processes described, there is no attempt to analyze whether the new blocks are identical with other already existing blocks. As a consequence, they do not need to be inserted in the tree structure keeping track of unique blocks. However, in a later analysis phase, one could revisit the content of all blocks including the newly created to find more opportunities for deduplication.

Compression, Decompression and Recompression of Memory Blocks

Figure 11:
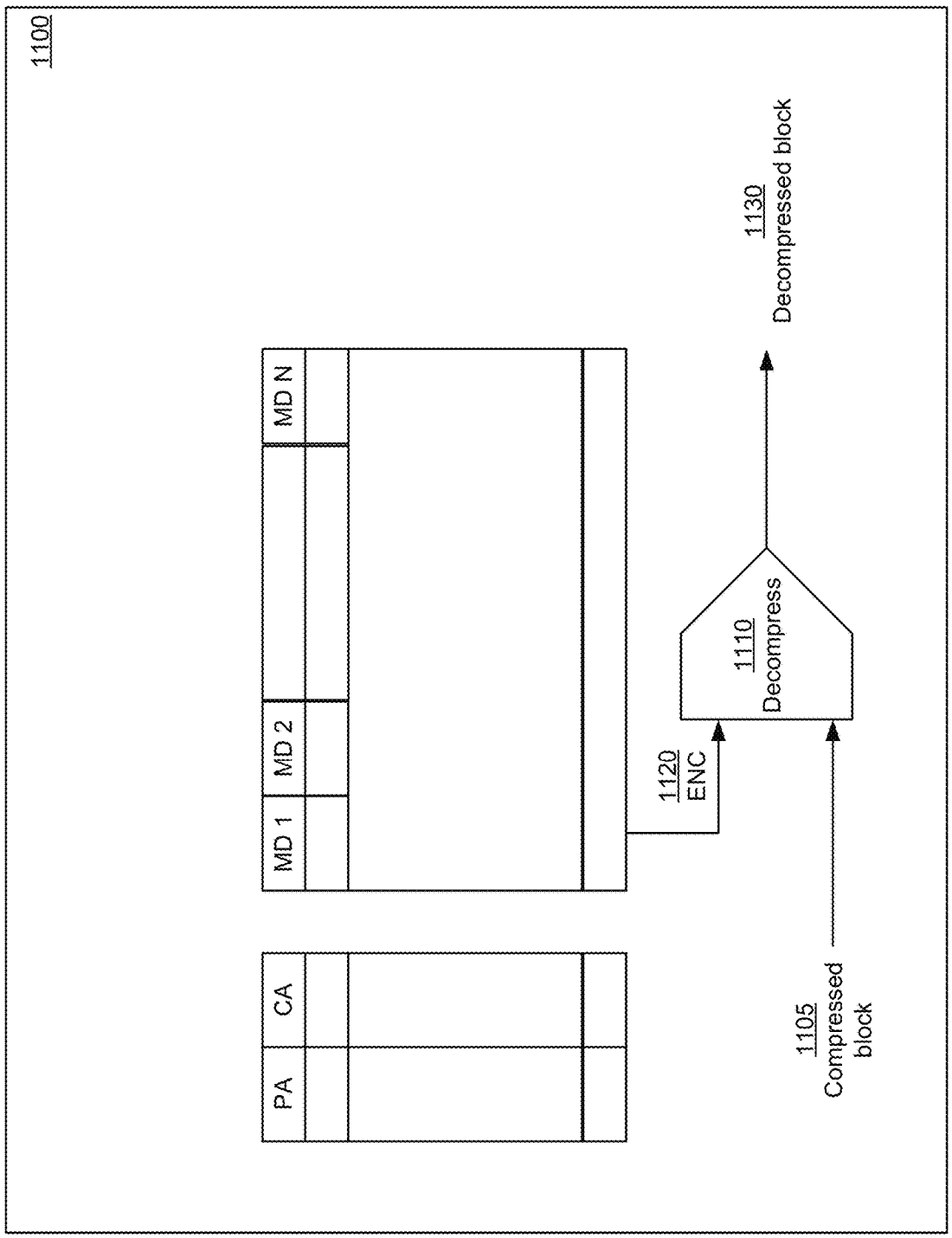
FIG. 11 depicts a decompressor unit to decompress a memory block using deduplication and value-redundancy removal compression.

Part of the metadata of FIG. 5 encompasses the compression algorithm used for the encoding (ENC at 520). After the block is retrieved from memory, it will be decompressed. This is illustrated in FIG. 11 by a decompressor unit 1110 that takes as input the type of compression algorithm (ENC) and the decompressed block from memory. The type of compression algorithm can be deduplication, entropy-based compression, delta encoding (e.g. base-delta-immediate encoding) or any other compression method that aims at removing value redundancy.

In the event that a block is being replaced from the last-level cache C3 of the exemplary embodiment of FIG. 2, that block might have been modified and may then generate a write-back request. Then it must be compressed before being written back to memory. The locator (address translation) unit 211 of FIG. 2 is interrogated. If it has an entry of the metadata for the page to which the said block belongs to, that metadata will encode which compression algorithm will be used to compress the block. Referring back to the scenarios of FIG. 8 and FIG. 9, it may happen that the write-back request is for a unique block (FIG. 8) or a deduplicated block (FIG. 9). In these cases, the address-translation unit and associated logic will aid in changing the metadata to help reducing the number of duplicates to be generated in this process.

The description of FIG. 8 to FIG. 11 can be summarized and generalized as follows. The computer memory compression device 205 may advantageously be configured for:
receiving a read request for a memory block in a memory page having a physical memory page address PA;
determining a compressed memory page address CA from a look-up table 1010;
retrieving metadata 1020 for the memory block;
calculating a compressed memory block address 1040 from the compressed memory page address CA and the unique memory object reference 530, U_PTR of the retrieved metadata;
retrieving a compressed memory block 1105 at the calculated compressed memory block address 1040; and
decompressing, by the decompressor unit 213; 1110, the retrieved compressed memory block 1105 using the information 520; 1120, ENC which is indicative of the type of compression and is available in the retrieved metadata for the memory block.

As was explained with reference to FIG. 8, the computer memory compression device 205 may advantageously be further configured for:
receiving a write-back request involving an update of a unique memory block at an original memory location 830;
copying the unique memory block 830 prior to update to a new memory location 870 in a dedicated free memory area 840 of the computer memory content;
updating the metadata of duplicate memory blocks 810, 820 linked to the unique memory block 830, such that the duplicate memory object references 540, D_PTR thereof are redirected to the new memory location 870 in the dedicated free memory area 840; and
updating the unique memory block at its original memory location 830 in accordance with the write-back request.

Also, the computer memory compression device 205 may advantageously be further configured for:
providing metadata which includes a reference F_PTR to a starting address 805 of the dedicated free memory area 840; and
updating said reference F_PTR to reflect a new starting address 880 after the copying of the unique memory block 830 to the new memory location 870 in the dedicated free memory area 840.

As was explained as an alternative to FIG. 8, the computer memory compression device 205 may advantageously be further configured for:
receiving a write-back request involving an update of a unique memory block 830 at an original memory location;
finding a deduplicated memory block 820 being a duplicate of the unique memory block 830;
promoting the found deduplicated memory block 820 as unique in the tree data structure 400 by using the signature S of the unique memory block 830;
writing updated contents of the unique memory block 830 according to the write-back request to a new memory location 870 in a dedicated free memory area 840; and
updating the metadata of the unique memory block 830 such that the unique memory object reference 530, U_PTR thereof is redirected to the new memory location 870 in the dedicated free memory area 840, whereas any duplicate memory object references 540, D_PTR thereof are removed.

Also, the computer memory compression device 205 may advantageously be further configured for:
providing metadata which includes a reference F_PTR to a starting address 805 of the dedicated free memory area 840; and
updating said reference F_PTR to reflect a new starting address 880 after the writing of the updated contents of the unique memory block 830 according to the write-back request to the new memory location 870 in the dedicated free memory area 840.

As was explained with reference to FIG. 9, the computer memory compression device 205 may advantageously be further configured for:
receiving a write-back request involving an update of a duplicate memory block 920;
storing the contents of the updated duplicate memory block as a new unique memory block 980 in a dedicated free memory area 940; and
updating the metadata of a unique memory block 910 previously linked to the duplicate memory block 920 to reflect that the unique memory block 910 is no longer linked to the duplicate memory block 920 while maintaining any links between the unique memory block 910 and other duplicate memory blocks 930.

As a result of write-back requests, unique and deduplicated copies will be updated and will end up in the free area used to avoid unnecessary duplication to happen, as explained in relation to FIG. 8 and FIG. 9. However, over time, this can have the effect that the compression ratio deteriorates. In one embodiment, the compression ratio is constantly monitored. When it surpasses a pre-set threshold, a process is initiated aiming at analyzing a memory page with respect to the occurrence of duplicates and value redundancy to perform recompression of the page. These processes can be the same as the ones depicted in FIG. 6 and FIG. 7. In another embodiment, pages are visited periodically to assess whether recompression is needed. When it is deemed necessary, the processes depicted in FIG. 6 and FIG. 7 and explained in previous paragraphs are activated.

Accordingly, the computer memory compression device 205 may advantageously be further configured for:
- monitoring compression ratio over time for a memory page; and
- if the compression ratio does not satisfy a given criterion, performing recompression of the memory page by performing the functionality of the computer memory compression method 1200 as described in this document.

Alternatively, or additionally, the computer memory compression device 205 may be further configured for periodically performing recompression of a memory page to improve compression ratio by performing the functionality of the computer memory compression method 1200 as described in this document.

Although the inventive aspects have been described in this document by referring to the example embodiments, the inventive aspects are not limited to the disclosed embodiments but they cover alternative embodiments that can be realized by someone skilled in the art.

One alternative inventive aspect can be seen as a system for analysis of computer memory data with the purpose of compressing it by eliminating duplicates of data items and value redundancy, the system comprising means to eliminate duplicates and value redundancy, means to locate data items after duplicate and value redundancy removal, means for compressing and decompressing data items using said compression method, and means for recompressing data items.

Another alternative inventive aspect can be seen as a method for analysis of computer memory data with the purpose of compressing it by eliminating duplicates of data items and value redundancy, the method comprising the steps of eliminating duplicates and value redundancy, locating data items after duplicate and value redundancy removal, compressing and decompressing data items using said compression method, and recompressing data items.

Yet another alternative inventive aspect can be seen as a device for analysis of computer memory data with the purpose of compressing it by eliminating duplicates of data items and value redundancy, the device being configured to eliminate duplicates and value redundancy, locate data items after duplicate and value redundancy removal, compress and decompress data items using said compression method, and recompress data items.

Still another alternative inventive aspect can be seen as the disclosed invention comprises a system for data analysis with means to analyze the content of pages in main memory with respect to the occurrence of duplicates of memory blocks and with respect to occurrence of value redundancy of the remaining unique memory blocks. The disclosed invention comprises also a system with means for removing duplicates and value redundancy of memory. Furthermore, the disclosed invention comprises a system with means to locate individual memory blocks after duplicates and value redundancy have been removed and means for compression and decompression of memory blocks using the same. Finally, the disclosed invention comprises systems with means to re-compress memory pages.

Further alternative inventive aspect can be seen as methods that analyze the content of pages in main memory with respect to the occurrence of duplicates of memory blocks and with respect to the relative frequency of values in the remaining unique memory blocks; methods for encoding memory blocks taking into account both deduplication and value-locality-based encoding methods; and methods for locating individual memory blocks in the compressed memory for the family of combined deduplication and value-locality-based compression technique and methods for compressing and decompressing memory blocks using the same. Finally, the disclosed invention comprises methods for re-compressing memory pages.

Other alternative inventive aspect can be seen as a data analyzer device configured to analyze the content of pages in main memory with respect to the occurrence of duplicates of memory blocks and with respect to value redundancy of the remaining unique memory blocks; a data encoder device configured to encode memory blocks taking into account removal of duplicates as well as value redundancy in remaining unique blocks; a memory block locator device configured to locate individual memory blocks in the compressed memory for the family of combined deduplication and value-locality-based compression technique and devices configured to compress and decompress memory blocks using the same; and devices configures to re-compress memory pages.

The invention claimed is:

1. A computer memory compression method, comprising:
analyzing computer memory content with respect to occurrence of duplicate memory objects as well as value redundancy of data values in unique memory objects;
encoding said computer memory content by eliminating said duplicate memory objects and compressing each remaining unique memory object by exploiting data value locality of the data values thereof;
providing metadata representing the memory objects of the encoded computer memory content, wherein the metadata reflects eliminated duplicate memory objects, remaining unique memory objects as well as a type of compression used for compressing each remaining unique memory object, wherein the metadata comprises, for each memory object of the encoded computer memory content:
information indicative of the memory object being an eliminated duplicate memory object or a remaining unique memory object;
when the memory object is a remaining unique memory object, information indicative of the type of compression used and a unique memory object reference to the remaining unique memory object;
when the memory object is an eliminated duplicate memory object, a unique memory object reference to a unique memory object having non- compressed contents being identical to the eliminated duplicate memory object; and
for each memory object being a unique memory object, a duplicate memory object reference to an eliminated duplicate memory object. the non-compressed contents of which are identical to the unique memory object; and
locating a memory object in the encoded computer memory content using said metadata.

2. The method as defined in claim 1, further comprising processing each individual memory object in the computer memory content by:
  creating a signature, the signature being a dense representation of the data values of the memory object;
  traversing a tree data structure to compare the created signature to signatures already represented in the tree data structure;
  if the created signature does not match any of the signatures represented in the tree data structure:
  inserting a node in the tree data structure;
  entering the created signature in the inserted node; and
  generating the metadata for said individual memory object with the information indicating that it is a unique memory object and the unique memory object reference to said individual memory object; and
  if the created signature matches a signature represented in the tree data structure:
    generating the metadata for said individual memory object with the information indicating that it is a duplicate memory object and the unique memory object reference to a unique memory block represented by the matching signature in the tree data structure; and
    updating the metadata of the unique memory block represented by the matching signature in the tree data structure to introduce a duplicate memory object reference to said individual memory object.

3. The method as defined in claim 2, further comprising, when the created signature matches a signature represented in the tree data structure:
  determining whether said individual memory object is identical to said unique memory block represented by said matching signature; and
  if said individual memory object and said unique memory block represented by said matching signature are not identical:
    inserting a node in the tree data structure;
    entering the created signature in the inserted node; and
    generating the metadata for said individual memory object with the information indicating that it is a unique memory object and the unique memory object reference to said individual memory object.

4. The method as defined in claim 2, further comprising, when all memory objects in the computer memory content have been processed:
  traversing the tree data structure to generate a value frequency table for the data values of the unique memory objects as represented by the nodes of the tree data structure; and
  compressing each unique memory object by an entropy-based compression scheme using the generated value frequency table.

5. The method as defined in claim 2, further comprising, when all memory objects in the computer memory content have been processed:
  traversing the tree data structure by examining the data values of the unique memory objects as represented by the nodes of the tree data structure and determining one or more base values; and
  compressing each unique memory object by a delta encoding-based compression scheme using the determined one or more base values.

6. The method as defined in claim 1, wherein said data values are of finer granularity than said memory objects, and said memory objects are of finer granularity than said computer memory content.

7. The method as defined in claim 6, wherein said computer memory content is a page of computer memory, said memory objects are memory blocks, and each memory block comprises a plurality of data values.

8. The method as defined in claim 7, wherein the metadata comprises, for each memory object of the encoded computer memory content:
  information indicative of the memory object being an eliminated duplicate memory object or a remaining unique memory object;
  when the memory object is a unique memory object, information indicative of the type of compression used and a unique memory object reference to the unique memory object; and
  when the memory object is a duplicate memory object, a unique memory object reference to a unique memory object, the non-compressed contents of which are identical to the duplicate memory object, and
  wherein the method further comprises:
  receiving a read request for a memory block in a memory page having a physical memory page address;
  determining a compressed memory page address from a look-up table;
  retrieving metadata for the memory block;
  calculating a compressed memory block address from the compressed memory page address and the unique memory object reference of the retrieved metadata;
  retrieving a compressed memory block at the calculated compressed memory block address; and
  decompressing the retrieved compressed memory block using the information indicative of the type of compression from the retrieved metadata for the memory block.

9. The method as defined in claim 7, wherein the metadata comprises, for each memory object of the encoded computer memory content:
  information indicative of the memory object being an eliminated duplicate memory object or a remaining unique memory object;
  when the memory object is a unique memory object, information indicative of the type of compression used and a unique memory object reference to the unique memory object; and
  when the memory object is a duplicate memory object, a unique memory object reference to a unique memory object, the non-compressed contents of which are identical to the duplicate memory object,
  wherein the metadata further comprises, for each memory object being a unique memory object, a duplicate memory object reference to an eliminated duplicate memory object, the non-compressed contents of which are identical to the unique memory object, and
  wherein the method further comprises:
  receiving a write-back request involving an update of a unique memory block at an original memory location;
  copying the unique memory block prior to update to a new memory location in a dedicated free memory area of the computer memory content;
  updating the metadata of duplicate memory blocks linked to the unique memory block such that the duplicate memory object references thereof are redirected to the new memory location in the dedicated free memory area; and
  updating the unique memory block at its original memory location in accordance with the write-back request.

10. The method as defined in claim 9, further comprising:
provifing metadata which includes a reference to a starting address of the dedicated free memory area; and
updating said reference to reflect a new starting address after the copying of the unique memory block to the new memory location in the dedicated free memory area.

11. The method as defined in claim 7, wherein the metadata comprises, for each memory object of the encoded computer memory content:
information indicative of the memory object being an eliminated duplicate memory object or a remaining unique memory object;
when the memory object is a unique memory object, information indicative of the type of compression used and a unique memory object reference to the unique memory object; and
when the memory object is a duplicate memory object, a unique memory object reference to a unique memory object, the non-compressed contents of which are identical to the duplicate memory object,
wherein the metadata further comprises, for each memory object being a unique memory object, a duplicate memory object reference to an eliminated duplicate memory object, the non-compressed contents of which are identical to the unique memory object,
wherein the method further comprises processing each individual memory object in the computer memory content by:
creating a signature, the signature being a dense representation of the data values of the memory object;
traversing a tree data structure to compare the created signature to signatures already represented in the tree data structure;
if the created signature does not match any of the signatures represented in the tree data structure:
inserting a node in the tree data structure;
entering the created signature in the inserted node; and
generating the metadata for said individual memory object with the information indicating that it is a unique memory object and the unique memory object reference to said individual memory object; and
if the created signature matches a signature represented in the tree data structure:
generating the metadata for said individual memory object with the information indicating that it is a duplicate memory object and the unique memory object reference to a unique memory block represented by the matching signature in the tree data structure; and
updating the metadata of the unique memory block represented by the matching signature in the tree data structure to introduce a duplicate memory object reference to said individual memory object, and
wherein the method further comprises:
receiving a write-back request involving an update of a unique memory block at an original memory location;
finding a deduplicated memory block being a duplicate of the unique memory block;
promoting the found deduplicated memory block as unique in the tree data structure by using the signature of the unique memory block;
writing updated contents of the unique memory block according to the write-back request to a new memory location in a dedicated free memory area; and
updating the metadata of the unique memory block such that the unique memory object reference thereof is redirected to the new memory location in the dedicated free memory area, whereas any duplicate memory object references thereof are removed.

12. The method as defined in claim 11, further comprising:
providing metadata which includes a reference to a starting address of the dedicated free memory area; and
updating said reference to reflect a new starting address after the writing of the updated contents of the unique memory block according to the write-back request to the new memory location in the dedicated free memory area.

13. The method as defined in claim 7, further comprising:
receiving a write-back request involving an update of a duplicate memory block;
storing the contents of the updated duplicate memory block as a new unique memory block in a dedicated free memory area; and
updating the metadata of a unique memory block previously linked to the duplicate memory block to reflect that said unique memory block is no longer linked to said duplicate memory block while maintaining any links between said unique memory block and other duplicate memory blocks.

14. The method as defined in claim 9, further comprising:
monitoring compression ratio over time for a memory page; and
if the compression ratio does not satisfy a given criterion, performing recompression of the memory page.

15. The method as defined in claim 13, further comprising:
periodically performing recompression of a memory page to improve compression ratio.

16. The method as defined in claim 1, wherein said compressing by exploiting data value locality involves one of:
entropy-based encoding;
delta encoding;
dictionary-based encoding; and
pattern-based encoding.

17. A computer memory compression device, comprising:
an analyzer hardware unit configured for analyzing computer memory content with respect to occurrence of duplicate memory objects as well as value redundancy of data values in unique memory objects;
an encoder hardware unit configured for encoding said computer memory content by eliminating said duplicate memory objects and compressing each remaining unique memory object by exploiting data value locality of the data values thereof, the encoder hardware unit further being configured for providing metadata representing the memory objects of the encoded computer memory content, wherein the metadata reflects eliminated duplicate memory objects, remaining unique memory objects as well as a type of compression used for compressing each remaining unique memory object, wherein the metadata comprises, for each memory object of the encoded computer memory content:
information indicative of the memory object being an eliminated duplicate memory object or a remaining unique memory object;
when the memory object is a remaining unique memory object, information indicative of the type of compression used and a unique memory object reference to the remaining unique memory object;
when the memory object is an eliminated duplicate memory object, a unique memory object reference to a unique memory object, having non-compressed contents being identical to the eliminated duplicate memory object; and for each memory object being a unique memory object, a duplicate memory object reference to an eliminated duplicate memory object, the non-compressed contents of which are identical to the unique memory object; and a locator hardware unit configured for locating a memory object in the encoded computer memory content using said metadata.

18. The device as defined in claim 17, wherein the analyzer hardware unit and the encoder hardware unit are configured for processing each individual memory object in the computer memory content by:

creating a signature, the signature being a dense representation of the data values of the memory object;

traversing a tree data structure to compare the created signature to signatures already represented in the tree data structure;

if the created signature does not match any of the signatures represented in the tree data structure:

inserting a node in the tree data structure;

entering the created signature in the inserted node; and generating the metadata for said individual memory object with the information indicating that it is a unique memory object and the unique memory object reference to said individual memory object; and if the created signature matches a signature represented in the tree data structure:

generating the metadata for said individual memory object with the information indicating that it is a duplicate memory object and the unique memory object reference to a unique memory block represented by the matching signature in the tree data structure; and updating the metadata of the unique memory block represented by the matching signature in the tree data structure to introduce a duplicate memory object reference to said individual memory object.

19. The device as defined in claim 18, wherein the analyzer hardware unit and the encoder hardware unit are further configured for, when the created signature matches a signature represented in the tree data structure:

determining whether said individual memory object is identical to said unique memory block represented by said matching signature; and if said individual memory object and said unique memory block represented by said matching signature are not identical:

inserting a node in the tree data structure;

entering the created signature in the inserted node; and generating the metadata for said individual memory object with the information indicating that it is a unique memory object and the unique memory object reference to said individual memory object.

20. The device as defined in claim 19, wherein the analyzer hardware unit and the encoder hardware unit are further configured for, when all memory objects in the computer memory content have been processed:

traversing the tree data structure to generate a value frequency table for the data values of the unique memory objects as represented by the nodes of the tree data structure; and compressing each unique memory object by an entropy-based compression scheme using the generated value frequency table.

21. The device as defined in claim 19, wherein the analyzer hardware unit and the encoder hardware unit are further configured for, when all memory objects in the computer memory content have been processed:

traversing the tree data structure by examining the data values of the unique memory objects as represented by the nodes of the tree data structure and determining one or more base values; and compressing each unique memory object by a delta encoding-based compression scheme using the determined one or more base values.

22. The device as defined in claim 17, wherein said data values are of finer granularity than said memory objects, and said memory objects are of finer granularity than said computer memory content.

23. The device as defined in claim 22, wherein said computer memory content is a page of computer memory, said memory objects are memory blocks, and each memory block comprises a plurality of data values.

24. The device as defined in claim 23, wherein the metadata comprises, for each memory object of the encoded computer memory content:

information indicative of the memory object being an eliminated duplicate memory object or a remaining unique memory object;

when the memory object is a unique memory object, information indicative of the type of compression used and a unique memory object reference to the unique memory object; and when the memory object is a duplicate memory object, a unique memory object reference to a unique memory object, the non-compressed contents of which are identical to the duplicate memory object, and wherein the device further comprises a decompressor hardware unit and is configured for:

receiving a read request for a memory block in a memory page having a physical memory page address;

determining a compressed memory page address from a look-up table;

retrieving metadata for the memory block;

calculating a compressed memory block address from the compressed memory page address and the unique memory object reference of the retrieved metadata;

retrieving a compressed memory block at the calculated compressed memory block address; and decompressing, by the decompressor hardware unit, the retrieved compressed memory block using the information indicative of the type of compression from the retrieved metadata for the memory block.

25. The device as defined in claim 23, wherein the metadata comprises, for each memory object of the encoded computer memory content:

information indicative of the memory object being an eliminated duplicate memory object or a remaining unique memory object;

when the memory object is a unique memory object, information indicative of the type of compression used and a unique memory object reference to the unique memory object; and when the memory object is a duplicate memory object, a unique memory object reference to a unique memory object, the non-compressed contents of which are identical to the duplicate memory object, wherein the metadata further comprises, for each memory object being a unique memory object, a duplicate memory object reference to an eliminated duplicate memory object, the non-compressed contents of which are identical to the unique memory object, and wherein the device is further configured for:

receiving a write-back request involving an update of a unique memory block at an original memory location;

copying the unique memory block prior to update to a new memory location in a dedicated free memory area of the computer memory content;

updating the metadata of duplicate memory blocks linked to the unique memory block, such that the duplicate memory object references thereof are redirected to the new memory location in the dedicated free memory area; and updating the unique memory block at its original memory location in accordance with the write-back request.

26. The device as defined in claim 25, further configured for:

providing metadata which includes a reference to a starting address of the dedicated free memory area; and updating said reference to reflect a new starting address after the copying of the unique memory block to the new memory location in the dedicated free memory area.

27. The device as defined in claim 23, wherein the metadata comprises, for each memory object of the encoded computer memory content:

information indicative of the memory object being an eliminated duplicate memory object or a remaining unique memory object;

when the memory object is a unique memory object, information indicative of the type of compression used and a unique memory object reference to the unique memory object; and when the memory object is a duplicate memory object, a unique memory object reference to a unique memory object, the non-compressed contents of which are identical to the duplicate memory object, wherein the metadata further comprises, for each memory object being a unique memory object, a duplicate memory object reference to an eliminated duplicate memory object, the non-compressed contents of which are identical to the unique memory object, wherein the analyzer hardware unit and the encoder hardware unit are configured for processing each individual memory object in the computer memory content by:

creating a signature, the signature being a dense representation of the data values of the memory object;

traversing a tree data structure to compare the created signature to signatures already represented in the tree data structure;

if the created signature does not match any of the signatures represented in the tree data structure:

inserting a node in the tree data structure;

entering the created signature in the inserted node; and generating the metadata for said individual memory object with the information indicating that it is a unique memory object and the unique memory object reference to said individual memory object; and if the created signature matches a signature represented in the tree data structure:

generating the metadata for said individual memory object with the information indicating that it is a duplicate memory object and the unique memory object reference to a unique memory block represented by the matching signature in the tree data structure; and updating the metadata of the unique memory block represented by the matching signature in the tree data structure to introduce a duplicate memory object reference to said individual memory object, and wherein the device is further configured for:

receiving a write-back request involving an update of a unique memory block at an original memory location;

finding a deduplicated memory block being a duplicate of the unique memory block;

promoting the found deduplicated memory block as unique in the tree data structure by using the signature of the unique memory block;

writing updated contents of the unique memory block according to the write-back request to a new memory location in a dedicated free memory area; and updating the metadata of the unique memory block such that the unique memory object reference thereof is redirected to the new memory location in the dedicated free memory area, whereas any duplicate memory object references thereof are removed.

28. The device as defined in claim 27, further configured for:

providing metadata which includes a reference to a starting address of the dedicated free memory area; and updating said reference to reflect a new starting address after the writing of the updated contents of the unique memory block according to the write-back request to the new memory location in the dedicated free memory area.

29. The device as defined in claim 23, further configured for:

receiving a write-back request involving an update of a duplicate memory block;

storing the contents of the updated duplicate memory block as a new unique memory block in a dedicated free memory area; and updating the metadata of a unique memory block previously linked to the duplicate memory block to reflect that said unique memory block is no longer linked to said duplicate memory block while maintaining any links between said unique memory block and other duplicate memory blocks.

30. The device as defined in claim 28, further configured for:

monitoring compression ratio over time for a memory page; and if the compression ratio does not satisfy a given criterion, performing recompression of the memory page, wherein performing recompression of the memory page comprises:

analyzing computer memory content with respect to occurrence of duplicate memory objects as well as value redundancy of data values in unique memory objects;

encoding said computer memory content by eliminating said duplicate memory objects and compressing each remaining unique memory object by exploiting data value locality of the data values thereof;

providing metadata representing the memory objects of the encoded computer memory content, wherein the metadata reflects eliminated duplicate memory objects, remaining unique memory objects as well as a type of compression used for compressing each remaining unique memory object; and locating a memory object in the encoded computer memory content using said metadata.

31. The device as defined in claim 28, further configured for:
periodically performing recompression of a memory page to improve compression ratio, wherein performing recompression of the memory page comprises:
analyzing computer memory content with respect to occurrence of duplicate memory objects as well as value redundancy of data values in unique memory objects;
encoding said computer memory content by eliminating said duplicate memory objects and compressing each remaining unique memory object by exploiting data value locality of the data values thereof;
providing metadata representing the memory objects of the encoded computer memory content, wherein the metadata reflects eliminated duplicate memory objects, remaining unique memory objects as well as a type of compression used for compressing each remaining unique memory object; and
locating a memory object in the encoded computer memory content using said metadata.

32. The device as defined in claim 17, wherein said encoder hardware unit is configured for compressing by exploiting data value locality by applying one of:
entropy-based compression; and
base-delta-immediate compression.

33. A computer system comprising:
one or more processors;
one or more computer memories; and
a computer memory compression device comprising:
an analyzer hardware unit configured for analyzing computer memory content with respect to occurrence of duplicate memory objects as well as value redundancy of data values in unique memory objects;
an encoder hardware unit configured for encoding said computer memory content by eliminating said duplicate memory objects and compressing each remaining unique memory object by exploiting data value locality of the data values thereof, the encoder hardware unit further being configured for providing metadata representing the memory objects of the encoded computer memory content, wherein the metadata reflects eliminated duplicate memory objects, remaining unique memory objects as well as a type of compression used for compressing each remaining unique memory object, wherein the metadata comprises, for each memory object of the encoded computer memory content:
information indicative of the memory object being an eliminated duplicate memory object or a remaining unique memory object:
when the memory object is a remaining unique memory object, information indicative of the type of compression used and a unique memory object reference to the remaining unique memory object;
when the memory object is an eliminated duplicate memory object, a unique memory object reference to a unique memory object, having non- compressed contents being identical to the eliminated duplicate memory object; and
for each memory object being a unique memory object, a duplicate memory object reference to an eliminated duplicate memory object, the non- compressed contents of which are identical to the unique memory object; and
a locator hardware unit configured for locating a memory object in the encoded computer memory content using said metadata.

* * * * *